US012777798B2

(12) United States Patent
Shin et al.

(10) Patent No.: US 12,777,798 B2
(45) Date of Patent: Oct. 27, 2026

(54) DISPLAY DEVICE

(71) Applicant: Samsung Display Co., LTD., Yongin-si (KR)

(72) Inventors: Dong Hee Shin, Yongin-si (KR); Sun Kwun Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 273 days.

(21) Appl. No.: 18/605,256

(22) Filed: Mar. 14, 2024

(65) Prior Publication Data

US 2024/0397767 A1 Nov. 28, 2024

(30) Foreign Application Priority Data

May 26, 2023 (KR) ........................ 10-2023-0068556

(51) Int. Cl.

| | |
|---|---|
| ***H10K 59/131*** | (2023.01) |
| ***H10K 59/121*** | (2023.01) |
| ***H10K 59/122*** | (2023.01) |
| ***H10K 59/35*** | (2023.01) |
| ***H10K 59/80*** | (2023.01) |
| *H10K 71/00* | (2023.01) |

(52) U.S. Cl.

CPC ....... *H10K 59/131* (2023.02); *H10K 59/1213* (2023.02); *H10K 59/1216* (2023.02); *H10K 59/122* (2023.02); *H10K 59/353* (2023.02); *H10K 59/80515* (2023.02); *H10K 71/861* (2023.02)

(58) Field of Classification Search

CPC ............. H10K 59/122; H10K 59/1213; H10K 59/1216; H10K 59/131; H10K 59/353; H10K 59/80515

See application file for complete search history.

(56) References Cited

U.S. PATENT DOCUMENTS

| | | | | |
|---|---|---|---|---|
| 11,373,599 B1 * | 6/2022 | Chen | .................... | H10K 59/131 |
| 11,569,327 B2 * | 1/2023 | Kwak | .................. | H10D 86/441 |
| 12,217,680 B2 * | 2/2025 | Shin | ..................... | H10K 59/353 |
| 2019/0207163 A1 * | 7/2019 | Paek | ......................... | G09G 3/32 |
| 2020/0119115 A1 * | 4/2020 | Moon | ................ | H10K 59/1216 |
| 2023/0246146 A1 | 8/2023 | Shin et al. | | |

(Continued)

FOREIGN PATENT DOCUMENTS

KR 10-2023-0117003 8/2023

*Primary Examiner* — Bac H Au

(74) *Attorney, Agent, or Firm* — F. CHAU & ASSOCIATES, LLC

(57) ABSTRACT

A pixel circuit layer may include a first power line, a sensing line, a second power line, and a data line disposed spaced apart from each other in a first direction and extending in a second direction crossing the first direction, and a sensing control line disposed on one side of the first power line, the sensing line, the second power line, and the data line and extending in the first direction in a plan view. The sensing control line may include a first protrusion extending between the sensing line and the second power line and a second protrusion spaced apart from the first protrusion and extending between the second power line and the data line. The first protrusion may include gate electrodes of a third transistor of the first and second sub-pixels, and the second protrusion may include a gate electrode of a third transistor of the third sub-pixel.

20 Claims, 15 Drawing Sheets

(56) References Cited

U.S. PATENT DOCUMENTS

| | | | | |
|---|---|---|---|---|
| 2023/0307461 | A1* | 9/2023 | Shin | H10D 86/60 |
| 2023/0343913 | A1* | 10/2023 | Cha | H10H 20/857 |
| 2024/0244906 | A1* | 7/2024 | Son | H10K 59/1216 |

* cited by examiner

DISPLAY DEVICE

This application claims priority to Korean Patent Application No. 10-2023-0068556, filed on, May 26, 2023, and all the benefits accruing therefrom under 35 U.S.C. § 119, the content of which in its entirety is herein incorporated by reference.

BACKGROUND

1. Field

The disclosure relates to a display device.

2. Description of the Related Art

As interest in information display increases and a demand to use portable information media increases, a demand and commercialization for a display device are focused.

SUMMARY

An object of the disclosure is to performing a repair process of a pixel circuit in a manufacturing process of a display device while securing an area (or an aperture ratio) in which a first pixel electrode is disposed by controlling a position of a sensing control line configuring the pixel circuit.

However, an object of the disclosure is not limited to the above-described objects, and may be variously expanded without departing from the spirit and scope of the disclosure.

A display device according to embodiments of the disclosure may include a substrate including a first sub-pixel, a second sub-pixel, and a third sub-pixel, a pixel circuit layer disposed on the substrate and including a plurality of transistors, and a display element layer disposed on the pixel circuit layer and including first pixel electrodes of each of the first to third sub-pixels. The pixel circuit layer may include a first power line, a sensing line, a second power line, and a data line sequentially disposed spaced apart from each other in a first direction and extending in a second direction crossing the first direction, and a sensing control line disposed on one side of the first power line, the sensing line, the second power line, and the data line and extending in the first direction in a plan view. The sensing control line may include a first protrusion extending between the sensing line and the second power line and a second protrusion spaced apart from the first protrusion and extending between the second power line and the data line. The first protrusion may include gate electrodes of a third transistor of the first and second sub-pixels, and the second protrusion may include a gate electrode of a third transistor of the third sub-pixel.

According to an embodiment, the first pixel electrode of the second sub-pixel may overlap a portion of the first protrusion and may not overlap the second protrusion in a plan view.

According to an embodiment, the first power line, the sensing line, the second power line, and the data line may be disposed in a first conductive layer, and the sensing control line may be disposed in a second conductive layer different from the first conductive layer.

According to an embodiment, the first protrusion may extend between the first power line and the sensing line and extend between the sensing line and the second power line through at least one bent portion.

According to an embodiment, the at least one bent portion of the first protrusion may overlap the sensing line in a plan view, and the at least one bent portion of the first protrusion may be disposed above the second protrusion.

According to an embodiment, the first pixel electrode of the third sub-pixel may not overlap the first protrusion and the second protrusion in a plan view.

According to an embodiment, the display element layer may further include light emitting layers disposed on the first pixel electrodes of each of the first to third sub-pixels, and the light emitting layer of the first sub-pixel, the light emitting layer of the second sub-pixel, and the light emitting layer of the third sub-pixel may be disposed spaced apart from each other in a diagonal direction between the first direction and the second direction.

According to an embodiment, the first pixel electrode of the third sub-pixel may not overlap the first protrusion and may overlap the second protrusion in a plan view.

According to an embodiment, the first pixel electrode of the second sub-pixel may surround one area of the first pixel electrode of the third sub-pixel, the light emitting layer of the second sub-pixel may be disposed in a left area below a light emitting area of the first sub-pixel, and the light emitting layer of the third sub-pixel may be disposed in a right area below the light emitting area of the first sub-pixel.

According to an embodiment, the data line may include a first data line, a second data line, and a third data line, the second data line, the third data line, and the first data line may be sequentially disposed spaced apart from each other in the first direction and extend in the second direction, and the second protrusion of the sensing control line may extend between the second power line and the second data line.

According to an embodiment, the display device may further include a plurality of storage capacitors arranged adjacent to each other along the second direction between the second power line and the second data line, and the second protrusion may be disposed between the second power line and the plurality of storage capacitors.

According to an embodiment, each of the plurality of storage capacitors may include an upper electrode and a lower electrode, and the upper electrode may be disposed in the same layer as the first power line, the sensing line, the second power line, and the data line.

According to an embodiment, the display element layer may further include a pixel defining layer including openings exposing the first pixel electrode of the first sub-pixel, the first pixel electrode of the second sub-pixel, and the first pixel electrode of the third sub-pixel, and the second protrusion of the sensing control line may overlap the pixel defining layer in a plan view.

According to an embodiment, one area of the first protrusion of the sensing control line may overlap the opening exposing the first pixel electrode of the second sub-pixel in a plan view.

A display device according to embodiments of the disclosure may include a substrate including a first sub-pixel, a second sub-pixel, and a third sub-pixel, a pixel circuit layer disposed on the substrate and including a plurality of transistors, and a display element layer disposed on the pixel circuit layer and including first pixel electrodes of each of the first to third sub-pixels. The pixel circuit layer may include a first power line, a sensing line, a second power line, and a data line sequentially disposed spaced apart from each other in a first direction and extending in a second direction crossing the first direction, and a sensing control line disposed on one side of the first power line, the sensing line, the second power line, and the data line and extending in the first direction in a plan view. The sensing control line may include a first protrusion extending between the second power line and the data line and a second protrusion extending from the first protrusion and extending between the sensing line and the second power line. The first protrusion may include a gate electrode of a third transistor of the third sub-pixel, and the second protrusion may include a gate electrode of a third transistor of the first sub-pixel and a gate electrode of a third transistor of the second sub-pixel.

According to an embodiment, the first pixel electrode of the second sub-pixel may overlap a portion of the second protrusion and may not overlap the first protrusion in a plan view.

According to an embodiment, the first power line, the sensing line, the second power line, and the data line may be disposed in a first conductive layer, and the sensing control line may be disposed in a second conductive layer different from the first conductive layer.

According to an embodiment, the second protrusion may extend from the first protrusion and extend between the sensing line and the second power line through at least one bent portion, and the at least one bent portion of the second protrusion may overlap the second power line in a plan view.

According to an embodiment, the first pixel electrode of the third sub-pixel may not overlap the first protrusion and the second protrusion in a plan view.

According to an embodiment, the display element layer may further include light emitting layers disposed on the first pixel electrodes of each of the first to third sub-pixels, and the light emitting layer of the first sub-pixel, the light emitting layer of the second sub-pixel, and the light emitting layer of the third sub-pixel may be disposed spaced apart from each other in a diagonal direction between the first direction and the second direction.

In the display device according to embodiments of the disclosure, a pixel electrode of a corresponding sub-pixel may be disposed so as not to overlap a gate electrode of an initialization transistor of an adjacent sub-pixel, and thus a repair process for a pixel circuit of the adjacent sub-pixel may be performed without removing the pixel electrode of the corresponding sub-pixel.

In addition, a gate electrode of an initialization transistor of the corresponding sub-pixel and a gate electrode of the initialization transistor of the adjacent sub-pixel may be disposed in different lines, and thus an area (or an aperture ratio) in which the pixel electrode of the corresponding sub-pixel is disposed may be secured.

However, an effect of the disclosure is not limited to the above-described effects, and may be variously expanded without departing from the spirit and scope of the disclosure.

DETAILED DESCRIPTION OF THE EMBODIMENT

Figure 1:
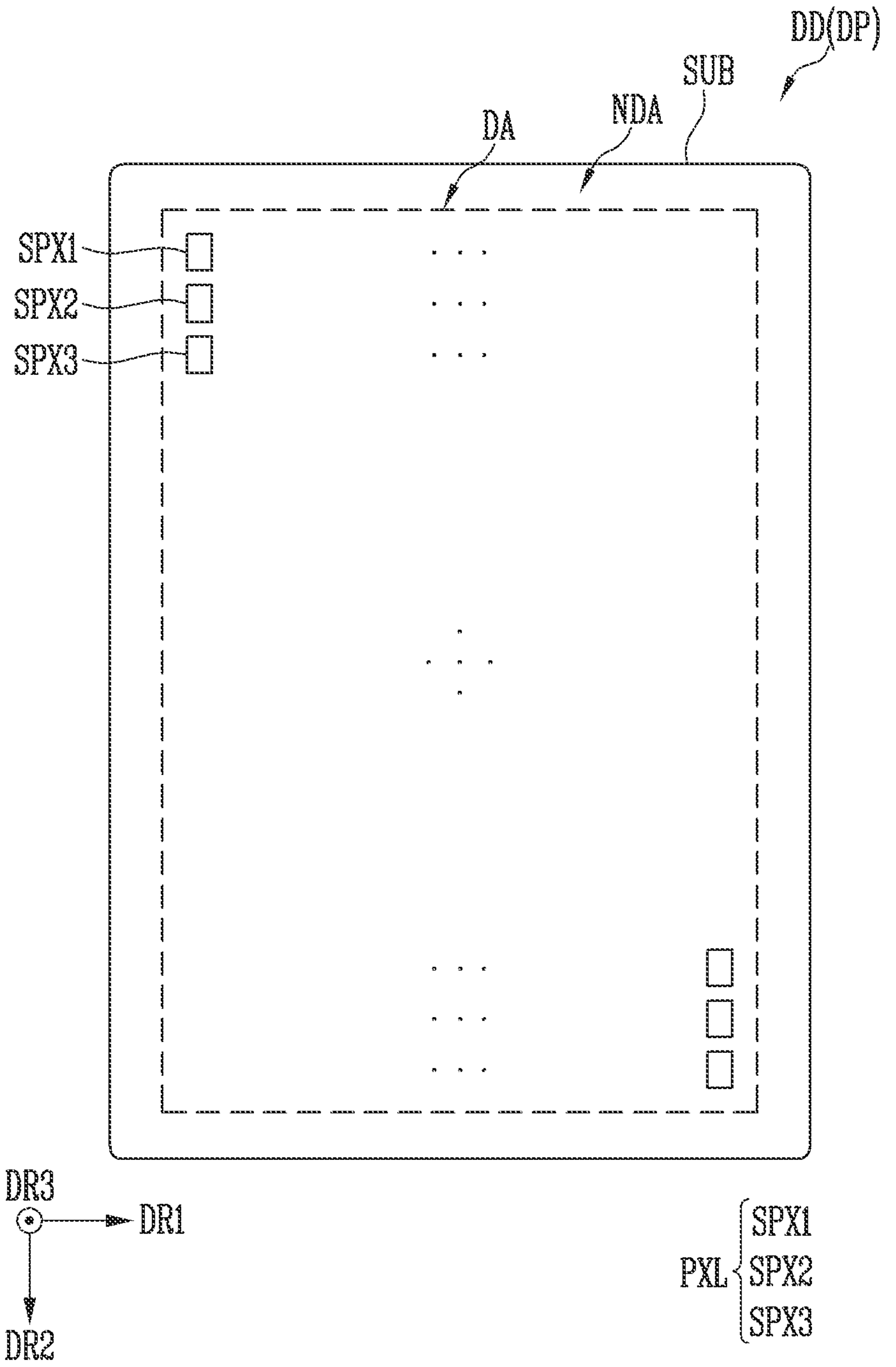
FIG. 1 is a plan view illustrating a display device according to embodiments of the disclosure.

Hereinafter, preferred embodiments of the disclosure will be described in more detail with reference to the accompanying drawings. The same reference numerals are used for the same components in the drawings, and an overlapping description of the same components is omitted.

Figure 2:
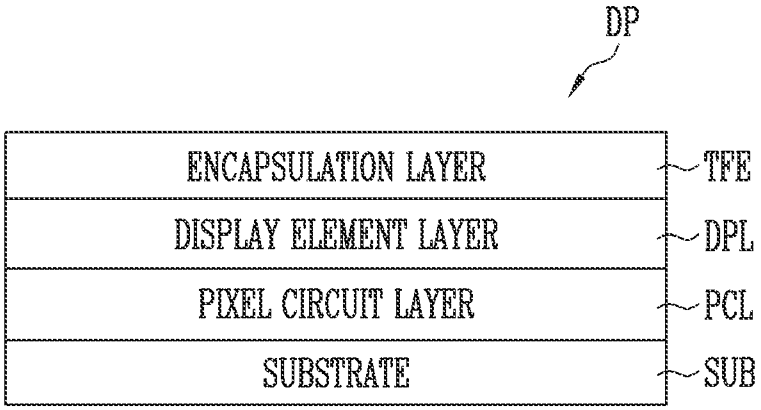
FIG. 2 is a schematic cross-sectional view illustrating a display panel of FIG. 1.

FIG. 1 is a plan view illustrating a display device according to embodiments of the disclosure. FIG. 2 is a schematic cross-sectional view illustrating a display panel of FIG. 1.

Referring to FIGS. 1 and 2, a structure of the display device DD and the display panel DP included in the display device DD may be briefly shown based on a display area DA where an image is displayed.

In FIGS. 1 and 2, for convenience, the structure of the display device DD, in particular, the display panel DP provided in the display device DD, is briefly shown based on the display area DA where an image is displayed.

Referring to FIGS. 1 and 2, the display panel DP (or the display device DD) according to an embodiment may be provided in various shapes, for example, a rectangular plate shape having two pairs of sides parallel to each other, but is not limited thereto. When the display panel DP is provided in a rectangular plate shape, one pair of sides of the two pairs of sides may be provided longer than the other pair of sides.

At least a portion of the display panel DP may have flexibility and may be folded at a portion having flexibility, but is not limited thereto.

The display panel DP may display an image. As the display panel DP, a display panel capable of self-emission such as an organic light emitting display panel (OLED panel) using an organic light emitting diode as a light emitting element, an ultra-small light emitting diode display panel (micro-LED or nano-LED display panel) using an ultra-small light emitting diode as a light emitting element, and a quantum dot organic light emitting display panel (QD OLED panel) using a quantum dot and an organic light emitting diode may be used. In addition, as the display panel DP, a non-emission display panel such as a liquid crystal display panel (LCD panel), an electro-phoretic display panel (EPD panel), and an electro-wetting display panel (EWD panel) may be used. When the non-emission display panel is used as the display panel DP, the display device DD may include a backlight unit supplying light to the display panel DP.

The display panel DP may include a substrate SUB and pixels PXL provided on the substrate SUB.

The substrate SUB may include a transparent insulating material to transmit light. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate including a polymeric organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, triacetate cellulose, and cellulose acetate propionate.

One area of the substrate SUB may be provided as the display area DA and pixels PXL may be disposed in the one area, and a remaining area of the substrate SUB may be provided as a non-display area NDA. For example, the substrate SUB may include the display area DA including pixel areas where each pixel PXL is disposed and the non-display area NDA disposed around the display area DA (or adjacent to the display area DA).

The non-display area NDA may be positioned adjacent to the display area DA. The non-display area NDA may be provided on at least one side of the display area DA. For example, the non-display area NDA may surround a circumference (or an edge) of the display area DA. A line unit connected to each pixel PXL and a driver connected to the line unit and driving the pixel PXL may be provided in the non-display area NDA.

The pixel PXL may include a plurality of sub-pixels. For example, the pixel PXL may include a first sub-pixel SPX1, a second sub-pixel SPX2, and a third sub-pixel SPX3. The first sub-pixel SPX1, the second sub-pixel SPX2, and the third sub-pixel SPX3 may be sequentially disposed in a second direction DR2. However, the disclosure is not limited thereto, and the first sub-pixel SPX1, the second sub-pixel SPX2, and the third sub-pixel SPX3 may be sequentially disposed in a first direction DR1 crossing the second direction DR2.

The first to third sub-pixels SPX1 to SPX3 may emit light in different colors. For example, the first sub-pixel SPX1 may be a red sub-pixel emitting red light, the second sub-pixel SPX2 may be a blue sub-pixel emitting blue light, and the third sub-pixel SPX3 may be a green sub-pixel emitting green light. However, a color, a type, the number, and/or the like of the sub-pixels configuring the pixel PXL are/is not particularly limited. For example, colors of the light emitted from each of the sub-pixels SPX1, SPX2, and SPX3 may be variously changed.

In addition, according to an embodiment, the first to third sub-pixels SPX1 to SPX3 may emit light in the same color. For example, all of the first to third sub-pixels SPX1 to SPX3 may be sub-pixels emitting red, green, or blue light. In this case, in order to configure a full-color of pixel PXL, an optical layer such as a light conversion layer and/or a color filter for converting a color of light emitted from a corresponding unit pixel may be disposed on at least a portion of the first to third sub-pixels SPX1 to SPX3.

In the following embodiment, when the first sub-pixel SPX1, the second sub-pixel SPX2, and the third sub-pixel SPX3 are comprehensively referred to, the first sub-pixel SPX1, the second sub-pixel SPX2, and the third sub-pixel SPX3 are referred to as sub-pixels SPX.

A plurality of pixels PXL may be provided and arranged in a matrix form along a row extending in a first direction DR1 and a column extending in a second direction DR2 crossing the first direction DR1. An arrangement form of the pixel PXL is not particularly limited, and the pixel PXL may be arranged in various forms. According to an embodiment, when a plurality of pixels PXL are provided, the plurality of pixels PXL may be provided to have different areas (or sizes). For example, in a case of pixels PXL having different colors of emitted light, the pixels PXL may be provided in different areas (or sizes) or different shapes for each color.

The driver may control driving of the pixel PXL by providing a predetermined signal and predetermined power to each pixel PXL through the line unit.

The display panel DP (or each of the pixels PXL) may include a pixel circuit layer PCL, a display element layer DPL, and an encapsulation layer TFE disposed on the substrate SUB.

The pixel circuit layer PCL may be provided on the substrate SUB and may include a plurality of transistors and signal lines connected to the transistor. For example, each transistor may have a shape in which a semiconductor pattern, a gate electrode, a source electrode, and a drain electrode are sequentially stacked with an insulating layer interposed therebetween. The semiconductor pattern may include amorphous silicon, poly silicon, low temperature poly silicon, an organic semiconductor, and/or an oxide semiconductor. The gate electrode, the source electrode, and the drain electrode may include one of aluminum (Al), copper (Cu), titanium (Ti), and molybdenum (Mo), but are not limited thereto. In addition, the pixel circuit layer PCL may include one or more insulating layers.

The display element layer DPL may be disposed on the pixel circuit layer PCL. The display element layer DPL may include a light emitting element emitting light. The light emitting element may be, for example, an organic light emitting diode, but is not limited thereto. According to an embodiment, the light emitting element may be an inorganic light emitting element including an inorganic light emitting material or a light emitting element emitting light by changing a wavelength of emitted light using a quantum dot.

The encapsulation layer TFE may be disposed on the display element layer DPL. The encapsulation layer TFE may be an encapsulation substrate or a form of an encapsulation film formed of a multilayer film. When the encapsulation layer TFE is in the form of the encapsulation film, the encapsulation layer TFE may include an inorganic film and/or an organic film. For example, the encapsulation layer TFE may have a form in which an inorganic film, an organic film, and an inorganic film are sequentially stacked. The encapsulation layer TFE may prevent penetration of external air and moisture into the display element layer DPL and the pixel circuit layer PCL.

Figure 3:
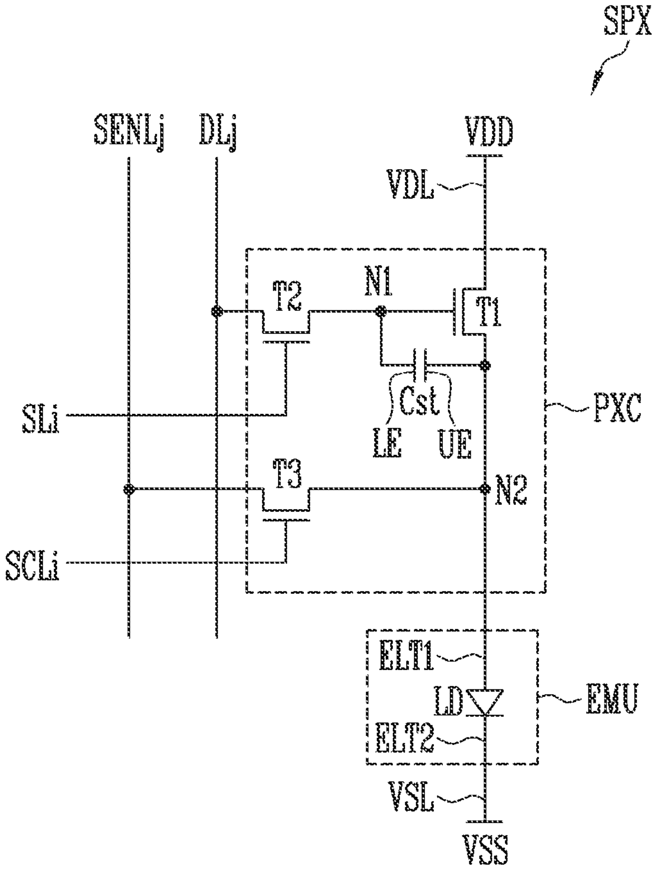
FIG. 3 is a schematic circuit diagram illustrating a sub-pixel of FIG. 1.

FIG. 3 is a schematic circuit diagram illustrating the sub-pixel of FIG. 1.

In FIG. 3, for convenience, a sub-pixel SPX positioned in an i-th pixel row (or an i-th horizontal line) and a j-th pixel column is shown (where i and j are natural numbers).

A light emitting unit EMU may include a light emitting element LD connected between a first power line VSL receiving a voltage of first driving power VSS (or first power) and a second power line VDL receiving a voltage of second driving power VDD (or second power). For example, the light emitting unit EMU may include the light emitting element LD including a first pixel electrode ELT1 connected to the second driving power VDD via a pixel circuit PXC and the second power line VDL and a second pixel electrode ELT2 connected to the first driving power VSS via the first power line VSL. The first pixel electrode ELT1 may be an anode, and the second pixel electrode ELT2 may be a cathode. The first driving power VSS and the second driving power VDD may have different potentials. At this time, a potential difference between the first driving power VSS and the second driving power VDD may be set to be higher than or equal to a threshold voltage of the light emitting element LD during an emission period of the sub-pixel SPX.

When the sub-pixel SPX is positioned in the i-th pixel row and the j-th pixel column in the display area DA, the pixel circuit PXC of the sub-pixel SPX may be electrically connected to an i-th scan line SLi and a j-th data line DLj. In addition, the pixel circuit PXC may be electrically connected to an i-th sensing control line SCLi and a j-th sensing line SENLj.

The above-described pixel circuit PXC may include first to third transistors T1 to T3 and a storage capacitor Cst.

The first transistor T1 may be a driving transistor for controlling a driving current applied to the light emitting element LD, and may be electrically connected between the second driving power VDD and the light emitting element LD. Specifically, a first terminal of the first transistor T1 may be electrically connected to the second driving power VDD through the second power line VDL, a second terminal of the first transistor T1 may be electrically connected to a second node N2, and a gate electrode of the first transistor T1 may be electrically connected to a first node N1. The first transistor T1 may control an amount of the driving current applied from the second driving power VDD to the light emitting element LD through the second node N2 according to a voltage applied to the first node N1. In an embodiment, the first terminal of the first transistor T1 may be a drain electrode, and the second terminal of the first transistor T1 may be a source electrode, but the disclosure is not limited thereto. According to an embodiment, the first terminal may be a source electrode and the second terminal may be a drain electrode.

The second transistor T2 may be a switching transistor that selects the sub-pixel SPX in response to a scan signal and activates the sub-pixel SPX, and may be electrically connected between the data line DLj (for example, the j-th data line) and the first node N1. A first terminal of the second transistor T2 may be electrically connected to the data line DLj, a second terminal of the second transistor T2 may be connected to the first node N1 (or the gate electrode of the first transistor T1), and a gate electrode of the second transistor T2 may be electrically connected to the scan line SLi (or the i-th scan line). The first terminal and the second terminal of the second transistor T2 may be different terminals, and for example, when the first terminal is a drain electrode, a second terminal may be a source electrode.

The second transistor T2 may be turned on when a scan signal of a gate-on voltage (for example, a high level voltage) is supplied from the scan line SLi, to electrically connect the data line DLj and the first node N1. The first node N1 may be a point where the second terminal of the second transistor T2 and the gate electrode of the first transistor T1 are connected, and the second transistor T2 may transfer a data signal to the gate electrode of the first transistor T1.

The third transistor T3 may obtain a sensing signal through the sensing line SENLj by electrically connecting the first transistor T1 to the sensing line SENLj (for example, the j-th sensing line), and detect a characteristics of the sub-pixel SPX including a threshold voltage of the first transistor T1 by using the sensing signal. Information on the characteristic of the sub-pixel SPX may be used to convert image data so that a characteristic deviation between the sub-pixels SPX may be compensated. A second terminal of the third transistor T3 may be electrically connected to the second terminal of the first transistor T1, a first terminal of the third transistor T3 may be electrically connected to the sensing line SENLj, and a gate electrode of the third transistor T3 may be electrically connected to the sensing control line SCLi (for example, the i-th control line). The first terminal may be a drain electrode, and the second terminal may be a source electrode.

The third transistor T3 may be an initialization transistor capable of initializing the second node N2, and may be turned on when a sensing control signal is supplied from the sensing control line SCLi to transfer a voltage of initialization power to the second node N2. Accordingly, the storage capacitor Cst electrically connected to the second node N2 may be initialized.

The storage capacitor Cst may include a lower electrode LE (or a first storage electrode) and an upper electrode UE (or a second storage electrode). The lower electrode LE may be electrically connected to the first node N1 and the upper electrode UE may be electrically connected to the second node N2. The storage capacitor Cst may charge a data voltage corresponding to the data signal supplied to the first node N1 during one frame period. Accordingly, the storage capacitor Cst may store a voltage corresponding to a difference between a voltage of the gate electrode of the first transistor T1 and a voltage of the second node N2.

In FIG. 3, an embodiment in which all of the first to third transistors T1 to T3 are N-type transistors is disclosed, but the disclosure is not limited thereto. For example, at least one of the above-described first to third transistors T1 to T3 may be changed to a P-type transistor. A structure of the pixel circuit PXC may be variously modified and implemented.

In the following embodiment, for convenience of description, a width direction (an X-axis direction, or a horizontal direction) on a plane is indicated as the first direction DR1, a height direction (a Y-axis direction, or a vertical direction) on the plane is indicated as the second direction DR2, and a vertical direction on a cross section is indicated as a third direction DR3.

Figure 4:
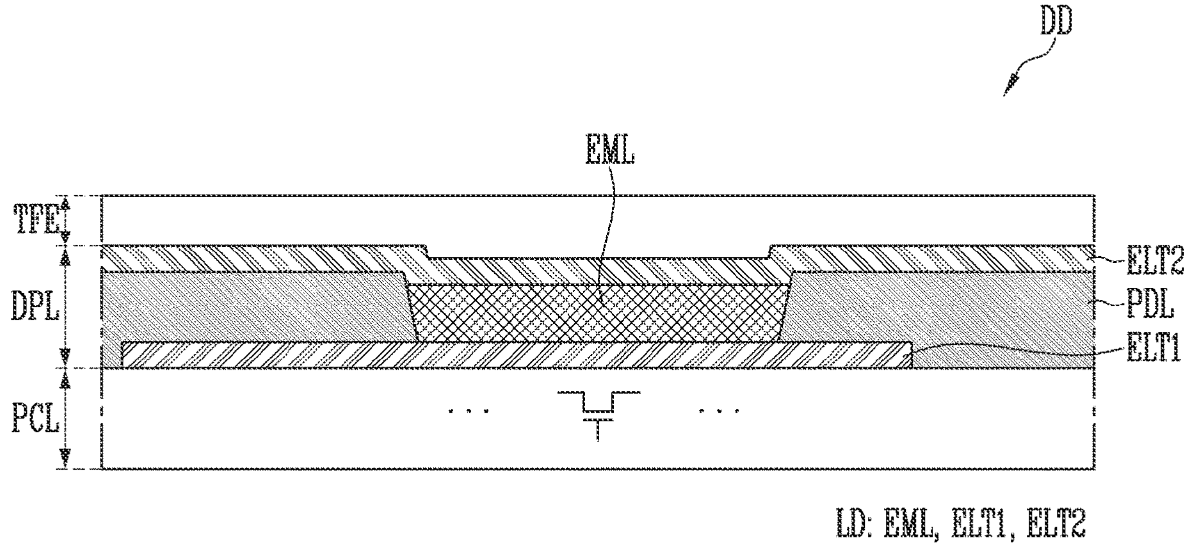
FIG. 4 is a schematic cross-sectional view of a display device including a light emitting element of FIG. 3.

FIG. 4 is a schematic cross-sectional view of the display device including the light emitting element of FIG. 3.

The display device DD (or the sub-pixel SPX) may include the light emitting element LD. The light emitting element LD may be provided in various forms. In the present specification, for convenience of description, the disclosure is described based on an embodiment in which the light emitting elements LD are organic light emitting diodes (OLEDs).

Referring to FIG. 4, the display device DD may include the pixel circuit layer PCL, the display element layer DPL, and the encapsulation layer TFE.

The light emitting element LD may be disposed on the pixel circuit layer PCL. According to an embodiment, the light emitting element LD may include the first pixel electrode ELT1, a light emitting layer EML, and the second pixel electrode ELT2. According to an embodiment, the light emitting layer EML may be disposed in an area defined by a pixel defining layer PDL. One surface of the light emitting layer EML may be electrically connected to the first pixel electrode ELT1, and another surface of the light emitting layer EML may be electrically connected to the second pixel electrode ELT2.

The first pixel electrode ELT1 may be an anode electrode for the light emitting layer EML, and the second pixel electrode ELT2 may be a common electrode (or a cathode electrode) for the light emitting layer EML. According to an embodiment, the first pixel electrode ELT1 and the second pixel electrode ELT2 may include a conductive material. For example, the first pixel electrode ELT1 may include a conductive material having a reflective property, and the second pixel electrode ELT2 may include a transparent conductive material, but the disclosure is not necessarily limited thereto.

The light emitting layer EML may have a multilayer thin film structure including a light generation layer. The light emitting layer EML may include a hole injection layer for injecting a hole, a hole transport layer having an excellent hole transport property and for increasing a chance of recombination of a hole and an electron by suppressing a movement of an electron that is not combined in the light generation layer, the light generation layer for emitting light by the recombination of the injected electron and hole, a hole blocking layer for suppressing a movement of a hole that is not combined in the light generation layer, an electron transport layer for smoothly transporting the electron to the light generation layer, and an electron injection layer for injecting the electron. The light emitting layer EML may emit light based on an electrical signal provided from the first pixel electrode ELT1 and the second pixel electrode ELT2.

The pixel defining layer PDL may be disposed on the pixel circuit layer PCL to define a position where the light emitting layer EML is arranged. The pixel defining layer PDL may include an organic material. According to an embodiment, the pixel defining layer PDL may include any one or more of a group of acrylic resin, epoxy resin, phenol resin, polyamide resin, and polyimide resin. However, the disclosure is not limited thereto.

The encapsulation layer TFE may be disposed on the light emitting element LD (for example, the second pixel electrode ELT2). The encapsulation layer TFE may offset a step difference generated by the light emitting elements LD and the pixel defining layer PDL. The encapsulation layer TFE may include a plurality of insulating layers covering the light emitting element LD.

Figure 5:
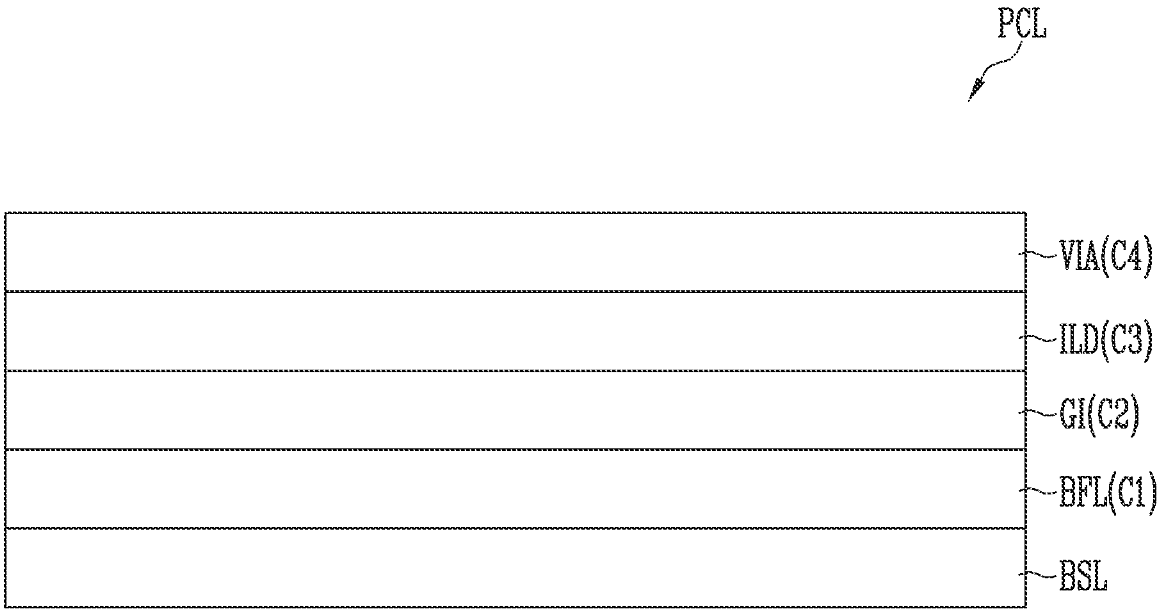
FIG. 5 is a schematic cross-sectional view illustrating an insulating layer (or a conductive layer) included in a pixel circuit layer of FIG. 2.

FIG. 5 is a schematic cross-sectional view illustrating an insulating layer (or a conductive layer) included in the pixel circuit layer of FIG. 2.

FIG. 5 is a schematic cross-sectional view illustrating a stack structure of the pixel circuit layer PCL according to an embodiment. Referring to FIG. 5, the pixel circuit layer PCL may be a structure in which a base layer BSL, a buffer layer BFL, a gate insulating layer GI, an interlayer insulating layer ILD, and a via layer VIA are sequentially stacked. Each of the buffer layer BFL, the gate insulating layer GI, the interlayer insulating layer ILD, and the via layer VIA may cover conductive patterns. For example, the buffer layer BFL may entirely cover a first conductive layer C1. The gate insulating layer GI may entirely cover a second conductive layer C2. The interlayer insulating layer ILD may entirely cover a third conductive layer C3. The via layer VIA may entirely cover a fourth conductive layer C4.

The base layer BSL (or substrate) may form (or configure) a base surface of the pixel circuit layer PCL. As described above, the base layer BSL may include various materials, and an example thereof is not particularly limited.

The buffer layer BFL may be a layer for preventing diffusion of an impurity or permeation of moisture into the first conductive layer C1. According to an embodiment, the buffer layer BFL may include one or more of a group of silicon nitride ($SiN_x$), silicon oxide ($SiO_x$), silicon oxynitride ($SiO_xN_y$), and aluminum oxide ($AlO_x$). However, the disclosure is not necessarily limited to the above-described example. In an example, the first conductive layer C1 may include a lower metal electrode (for example, first and second lower auxiliary electrodes BML1 and BML2 of FIG. 6).

The gate insulating layer GI may be disposed on the buffer layer BFL to prevent diffusion of an impurity or permeation of moisture into the second conductive layer C2. In an example, the second conductive layer C2 may include a semiconductor. For example, the second conductive layer C2 may include an active pattern of a transistor (for example, the first to third transistors T1 to T3 of FIG. 3). The active pattern may include at least one of a group of polysilicon, low temperature polycrystalline silicon (LTPS), amorphous silicon, and an oxide semiconductor.

The interlayer insulating layer ILD may be disposed on the gate insulating layer GI to completely cover the third conductive layer C3. The third conductive layer C3 may include a gate electrode of the transistor (for example, the first to third transistors T1 to T3 of FIG. 3). The gate electrode may include a conductive material. The conductive material may include one or more of a group of gold (Au), silver (Ag), aluminum (Al), molybdenum (Mo), chromium (Cr), titanium (Ti), nickel (Ni), neodymium (Nd), copper (Cu), and platinum (Pt). However, the disclosure is not necessarily limited to the above-described example.

The via layer VIA may be disposed on the interlayer insulating layer ILD to completely cover the fourth conductive layer C4. The fourth conductive layer C4 may include first and second power lines (for example, the first and second power lines VSL and VDL of FIG. 3), a sensing line (for example, the sensing line SENLj of FIG. 3), and a data line (for example, the data line DLj of FIG. 3). In an example, the fourth conductive layer C4 may further include an upper electrode (for example, the upper electrode UE of FIG. 3) of the storage capacitor.

Each of the gate insulating layer GI, the interlayer insulating layer ILD, and the via layer VIA may be disposed to electrically isolate the second to fourth conductive layers C2 to C4 from each other.

The gate insulating layer (GI), the interlayer insulating layer (ILD), and/or the via layer VIA may include one or more of a group of silicon nitride ($SiN_x$), silicon oxide ($SiO_x$), silicon oxynitride ($SiO_xN_y$), and aluminum oxide ($AlO_x$). However, the disclosure is not necessarily limited to the above-described example. According to an embodiment, the gate insulating layer GI, the interlayer insulating layer ILD, and/or the via layer VIA may include an organic material.

Figure 6:
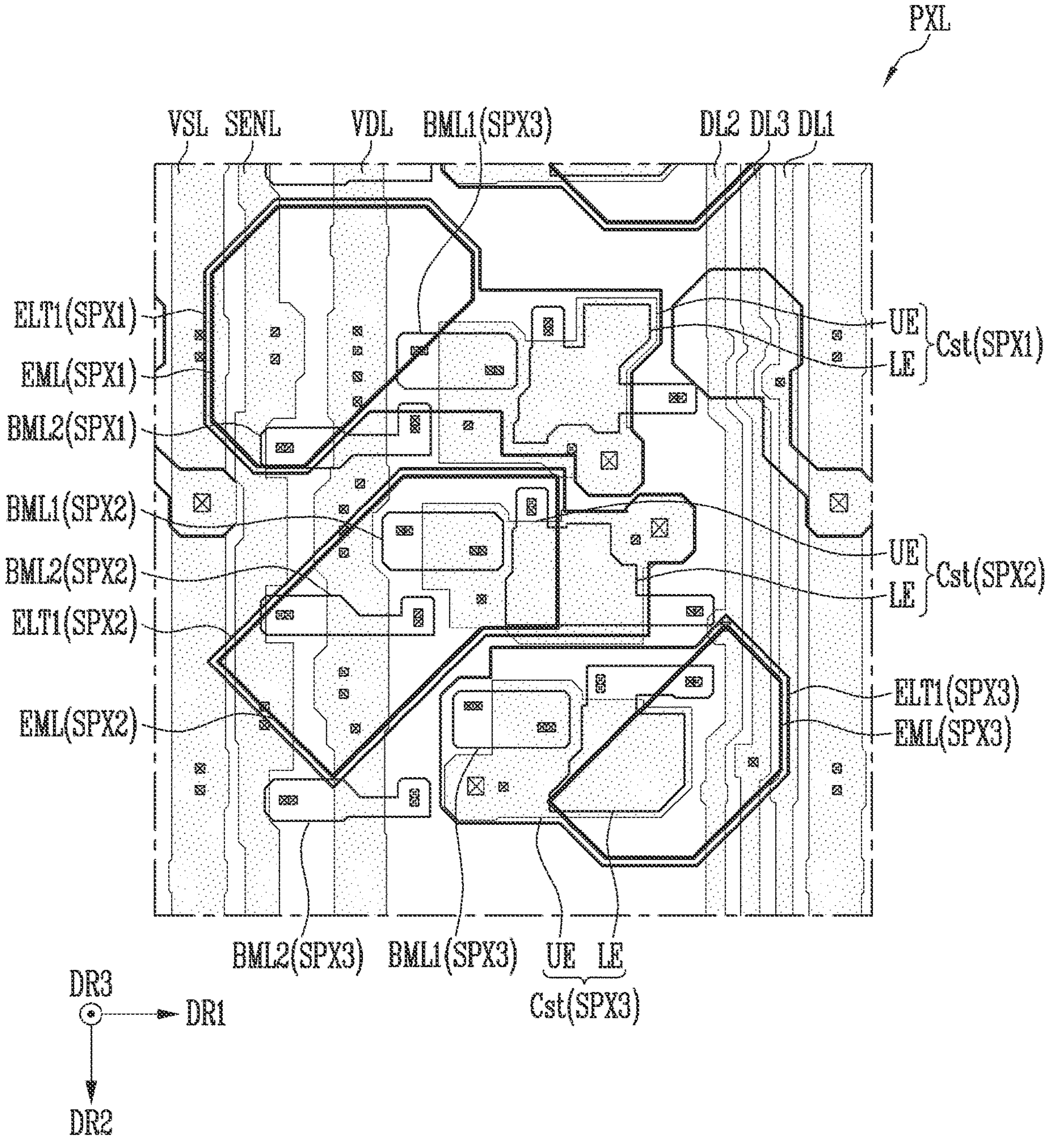
FIG. 6 is a schematic plan view illustrating a disposition of electrodes of a pixel of FIG. 1 and only some configurations of the pixel.

FIG. 6 is a schematic plan view illustrating a disposition of electrodes of the pixel of FIG. 1 and only some configurations of the pixel.

FIG. 6 is for describing a position where the first pixel electrodes ELT1 and the storage capacitors Cst configuring the first to third sub-pixels SPX1 to SPX3 are disposed, by including the first and second power lines VSL and VDL, a sensing line SENL, and data lines DL1 to DL3.

Referring to FIG. 6, the first pixel electrodes ELT1 included in the first to third sub-pixels SPX1 to SPX3 may be adjacently arranged along the second direction DR2. In an example, the first pixel electrode ELT1 of the first sub-pixel SPX1, the first pixel electrode ELT1 of the second sub-pixel SPX2, and the first pixel electrode ELT1 of the third sub-pixel SPX3 may be sequentially disposed along the second direction DR2.

In an embodiment, a pixel defining layer (for example, the pixel defining layer PDL of FIG. 10) may be disposed on the first pixel electrodes ELT1 of the respective first to third sub-pixels SPX1 to SPX3. The pixel defining layer may include an opening exposing the first pixel electrodes ELT1. The light emitting layer EML (light emitting area) may be disposed on the first pixel electrodes ELT1 exposed through the pixel defining layer. Although FIG. 6 shows only the light emitting layer EML disposed in an area corresponding to the opening of the pixel defining layer, the light emitting layer EML may be directly disposed on a partial area of the pixel defining layer. In this case, the light emitting area may be an area corresponding to the light emitting layer EML disposed on the first pixel electrode ELT1. In an example, the light emitting layer EML of the first sub-pixel SPX1, the light emitting layer EML of the second sub-pixel SPX2, and the light emitting layer EML of the third sub-pixel SPX3 may be disposed spaced apart in a diagonal direction between the first direction DR1 and the second direction DR2.

In an embodiment, the first pixel electrodes ELT1 and the light emitting layer EML included in the first to third sub-pixels SPX1 to SPX3 may be disposed in a display element layer (for example, the display element layer DPL of FIG. 2).

Referring to FIG. 6, the first power line VSL, the sensing line SENL, and the second power line VDL may be sequentially disposed spaced apart from each other in the first direction DR1. The data lines DL1 to DL3 may be disposed on a right side of the second power line VDL. In an example, the second data line DL2, the third data line DL3, and the first data line DL1 may be sequentially disposed spaced apart from each other in the first direction DR1. In an example, the second data line DL2 may be disposed on a right side of the second power line VDL. In an example, the first and second power lines VSL and VDL, the sensing line SENL, and the data lines DL1 to DL3 may extend in the second direction DR2.

In an embodiment, the plurality of storage capacitors Cst may be arranged adjacent to each other along the second direction DR2 between the second power line VDL and the data lines DL1 to DL3. The storage capacitors Cst included in the first to third sub-pixels SPX to SPX3 may be arranged adjacently along the second direction DR2. In an example, the storage capacitor Cst (or a first storage capacitor) of the first sub-pixel SPX1, the storage capacitor Cst (or a second storage capacitor) of the second sub-pixel SPX2, and the storage capacitors Cst of the third sub-pixels SPX3 may be sequentially disposed spaced apart from each other in the second direction DR2. In an example, the storage capacitor Cst of the first sub-pixel SPX1 may be disposed on an upper side of the pixel PXL, and the storage capacitor Cst of the third sub-pixel SPX3 may be disposed on a lower side of the pixel PXL. In an embodiment, each of the plurality of storage capacitors Cst may include the upper electrode UE and the lower electrode LE. In an example, one area of the lower electrode LE may overlap the upper electrode UE in a plan view.

In an embodiment, the first and second power lines VSL and VDL and the sensing line SENL may be disposed on one side (for example, a left side), and the first to third data lines DL1 to DL3 may be disposed on another side (for example, a right side) based on the plurality of storage capacitors Cst. The first pixel electrode ELT1 of each of the first to third sub-pixels SPX1 to SPX3 may overlap the storage capacitor Cst in a plan view.

Referring to FIG. 6, each of the first to third sub-pixels SPX1 to SPX3 may include the first and second lower auxiliary electrodes BML1 and BML2. The first and second lower auxiliary electrodes BML1 and BML2 may function as a path through which an electrical signal provided to the pixel circuit layer (for example, the pixel circuit layer PCL of FIG. 2) and the display element layer (for example, the display element layer DPL of FIG. 2) is moved. The first and second lower auxiliary electrodes BML1 and BML2 may include any one of aluminum (Al), copper (Cu), titanium (Ti), and molybdenum (Mo). In an example, the first lower auxiliary electrode BML1 may be disposed on a right side of the second power line VDL. In a plan view, the first lower auxiliary electrode BML may overlap the upper electrode UE of the storage capacitor Cst. In an example, the second lower auxiliary electrode BML2 may overlap the second power line VDL on a plane.

In an embodiment, the first and second power lines VSL and VDL, the sensing line SENL, the data lines DL1 to DL3, and the upper electrode UE of the storage capacitor Cst may be disposed on the same conductive layer (for example, the fourth conductive layer C4 of FIG. 5).

In an embodiment, the first and second lower auxiliary electrodes BML1 and BML2 and the lower electrode LE of the storage capacitor Cst may be disposed on the same conductive layer (for example, the first conductive layer C1 of FIG. 5).

Figure 7:
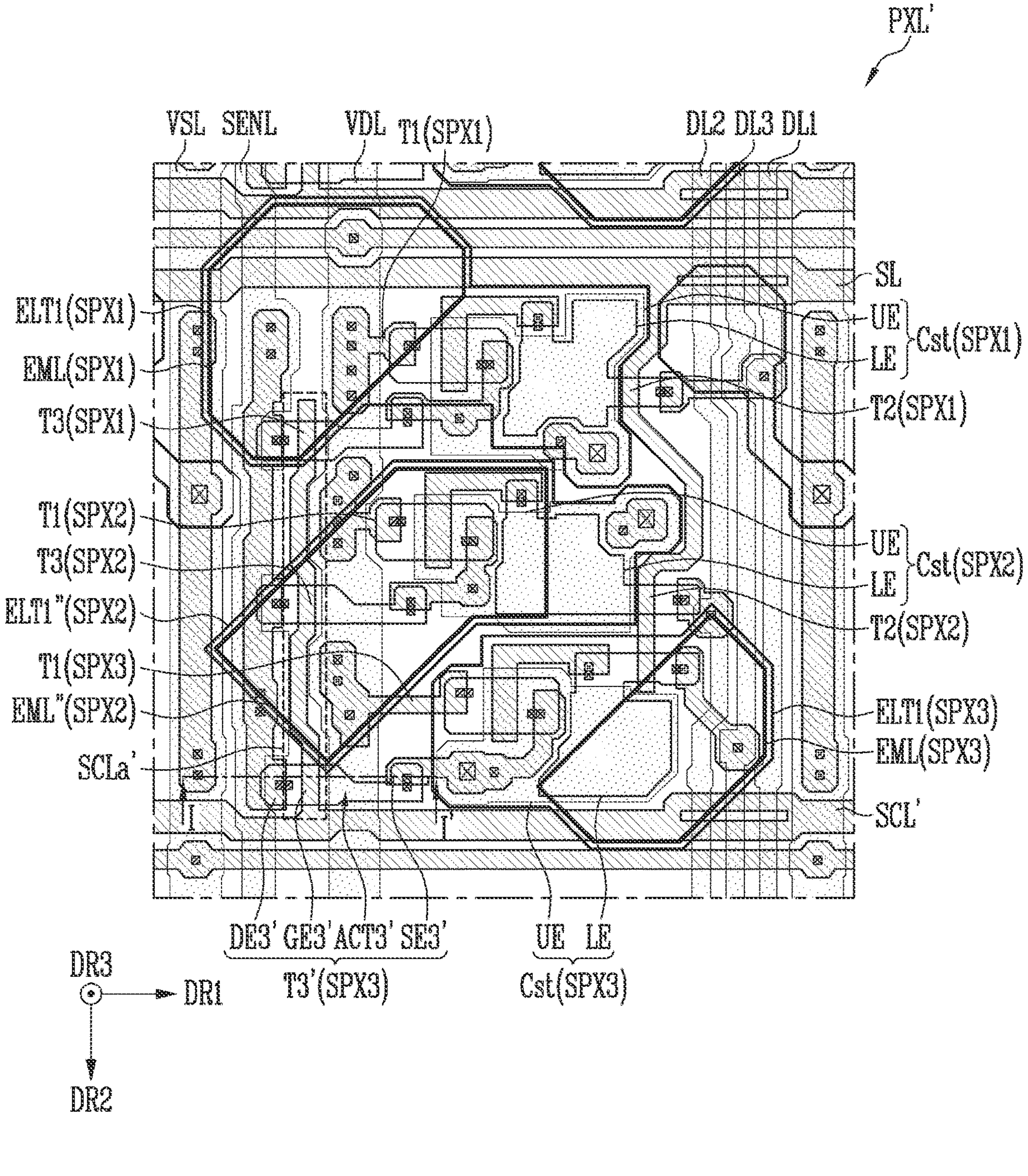
FIG. 7 is a schematic plan view illustrating a comparative example of the pixel.
Figure 8:
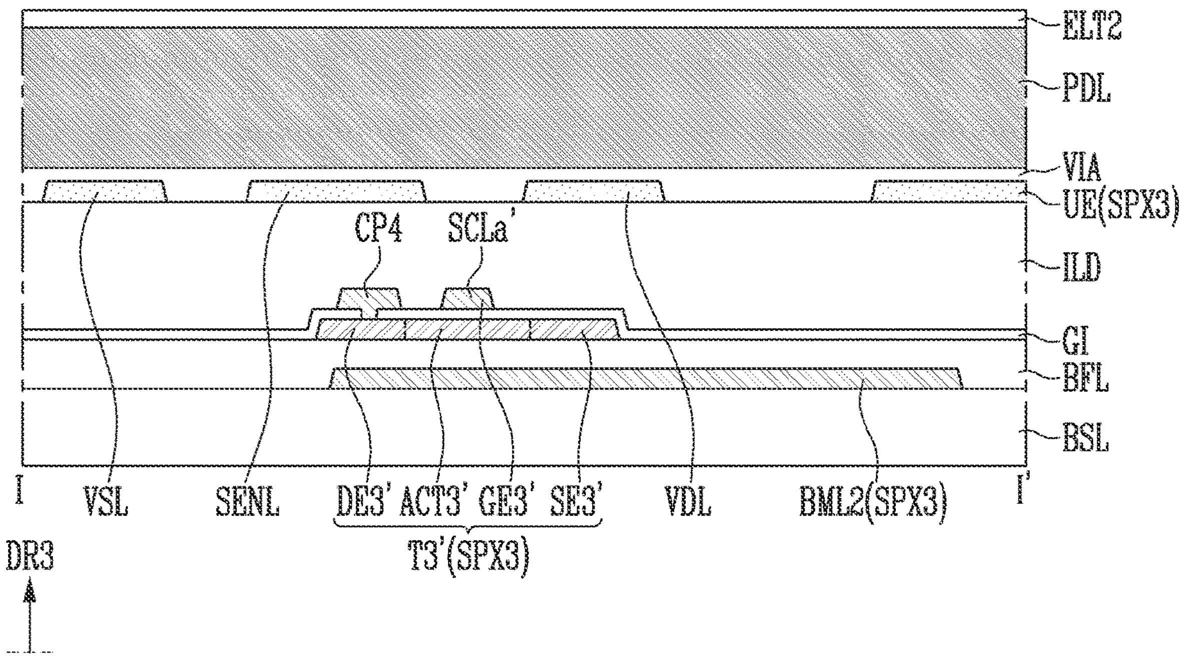
FIG. 8 is a schematic cross-sectional view taken along a line I-I' of FIG. 7.

FIG. 7 is a schematic plan view illustrating a comparative example of the pixel. FIG. 8 is a schematic cross-sectional view taken along a line I-I' of FIG. 7.

Referring to FIG. 7, the pixel PXL may include a sensing control line SCL'. The sensing control line SCL' may be disposed under the first and second power lines VSL and VDL, the sensing line SENL, and the first to third data lines DL1 to DL3 and may extend in the first direction DR1. The sensing control line SCL' may be spaced apart from the first and second power lines VSL and VDL, the sensing line SENL, and the data lines DL1 to DL3 in the second direction DR2 and may extend in the first direction DR1.

Each of the first and second sub-pixels SPX1 and SPX2 may include the first to third transistors T1 to T3. The third sub-pixel SPX3 may include the first and second transistors T1 and T2 and a third transistor T3'. The third transistor T3' may include initialization semiconductor layers SE3', ACT3', and DE3' and a third gate electrode GE3'. The initialization semiconductor layers SE3', ACT3', and DE3' may include a third source electrode SE3', a third drain electrode DE3', and a third active pattern ACT3' disposed between the third source electrode SE3' and the third drain electrode DE3'. The third active pattern ACT3' may be a channel area of the third transistor T3'.

The sensing control line SCL' may include a first protrusion SCLa' extending between the sensing line SENL and the second power line VDL. The first protrusion SCLa' may be a branch line divaricate from the sensing control line SCL.

The first protrusion SCLa' may include a third gate electrode of the third transistor T3 of the first and second sub-pixels SPX1 and SPX2 and the third gate electrode GE3' of the third transistor T3' of the third sub-pixel SPX3. That is, the third gate electrode of the third transistor T3 of the first and second sub-pixels SPX1 and SPX2 and the third gate electrode GE3' of the third transistor T3' of the third sub-pixel SPX3 may be formed by one first protrusion SCLa' extending between the sensing line SENL and the second power line VDL.

A first pixel electrode ELT1" and a light emitting layer EML" of the second sub-pixel SPX2 may not be disposed on the gate electrode GE3' of the third transistor T3' of the third sub-pixel SPX3 for a repair process of the third transistor T3' of the third sub-pixel SPX3. Accordingly, an area where the first pixel electrode ELT1" and the light emitting layer EML" of the second sub-pixel SPX2 are disposed may be limited by the gate electrode GE3' of the third transistor T3' of the third sub-pixel SPX3.

Referring to FIG. 8, the second lower auxiliary electrode BML2 of the third sub-pixel SPX3 may be disposed on the base layer BSL. The buffer layer BFL may be disposed to entirely cover the second lower auxiliary electrode BML2.

The initialization semiconductor layers SE3', ACT3', and DE3' of the third transistor T3' may be disposed on the buffer layer BFL. The gate insulating layer GI may be disposed to entirely cover the initialization semiconductor layers SE3', ACT3', and DE3' of the third transistor T3'.

A fourth connection pattern CP4 and the first protrusion SCLa' (or the gate electrode GE3' of the third sub-pixel SPX3) may be disposed on the gate insulating layer GI. The fourth connection pattern CP4 may be disposed in an area overlapping the drain electrode DE3'. The third drain electrode DE3' of the third transistor T3' may be electrically connected to the sensing line SENL through the fourth connection pattern CP4. The third source electrode SE3' may be electrically connected to the upper electrode UE of the storage capacitor Cst of the third sub-pixel SPX3. The gate electrode GE3' may overlap the active pattern ACT3'. The interlayer insulating layer ILD may be disposed to entirely cover the fourth connection pattern CP4' and the first protrusion SCLa' (or the gate electrode GE3' of the third sub-pixel SPX3).

The first power line VSL, the sensing line SENL, the second power line VDL, and the upper electrode UE of the third sub-pixel SPX3 may be sequentially disposed in the first direction DR1 on the interlayer insulating layer ILD. The via layer VIA may be disposed to entirely cover the first power line VSL, the sensing line SENL, the second power line VDL, and the upper electrode UE of the third sub-pixel SPX3.

The display element layer (for example, the display element layer DPL of FIG. 2) may be disposed on the via layer VIA. The display element layer DPL may include the pixel defining layer PDL and the second pixel electrode ELT2. The second pixel electrode ELT2 may be disposed on the pixel defining layer PDL.

Assuming that the first protrusion SCLa' of the sensing control line SCL' overlaps the first pixel electrode ELT1" of the second sub-pixel SPX2, in a manufacturing process of the display device, in order to perform a repair process of the third transistor T3' of the third sub-pixel SPX3, the first pixel electrode ELT1" of the second sub-pixel SPX2 is required to be removed. Therefore, the first pixel electrode ELT1" of the second sub-pixel SPX2 may not be disposed on the third transistor T3' of the third sub-pixel SPX3, and only the pixel defining layer PDL may be disposed. The third gate electrode of the third transistor T3 of the first and second sub-pixels SPX1 and SPX2 and the third gate electrode GE3' of the third transistor T3' of the third sub-pixel SPX3 may be formed by the first protrusion SLCa'. Accordingly, since the first pixel electrode ELT1" and the light emitting layer EML" of the second sub-pixel SPX2 adjacent to the third sub-pixel SPX3 are not disposed on the third gate electrode GE3' of the third transistor T3' of the third sub-pixel SPX3, the area where the first pixel electrode ELT1" and the light emitting layer EML" of the second sub-pixel SPX2 adjacent to the third sub-pixel SPX3 may be limited.

Figure 9:
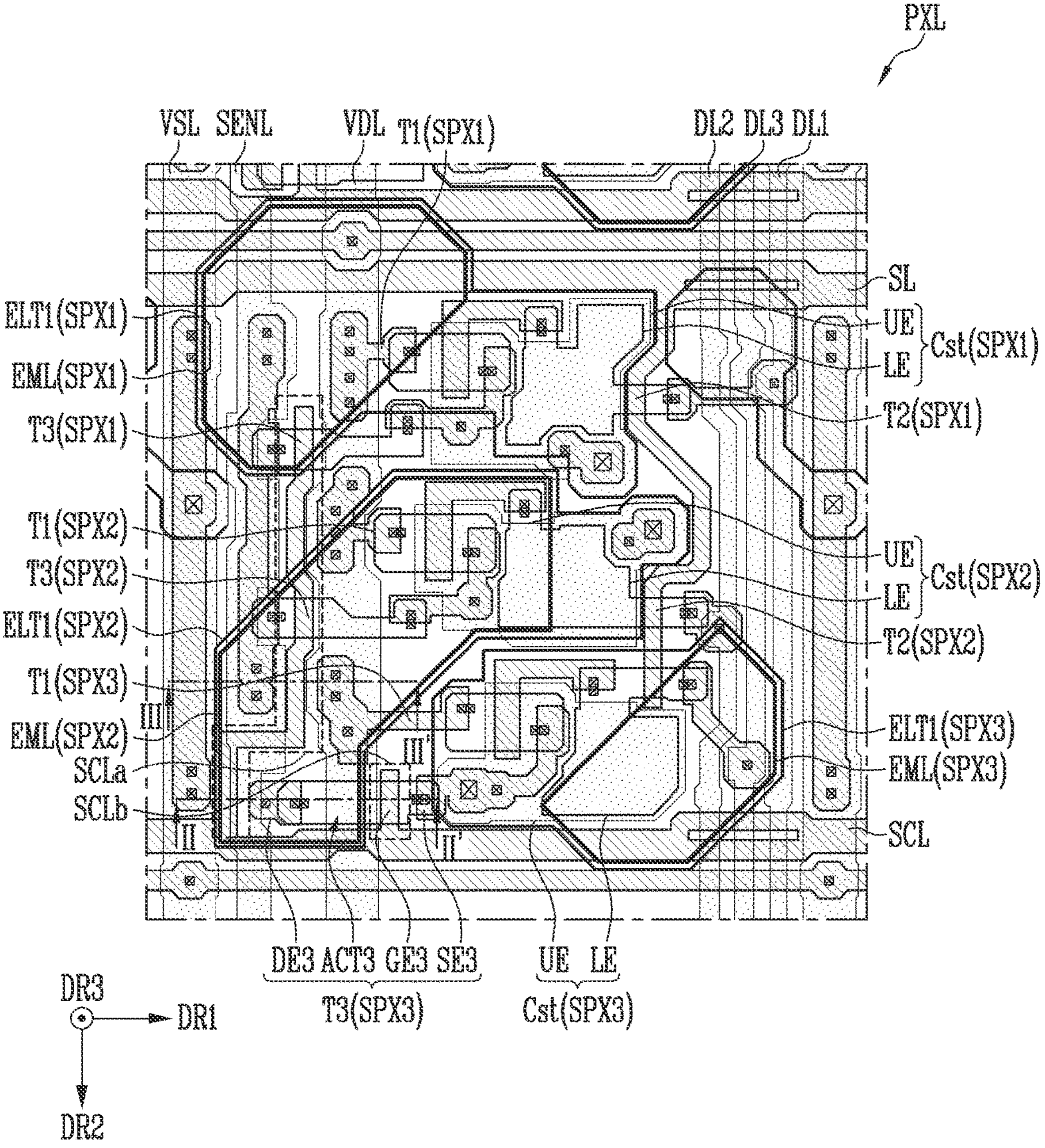
FIG. 9 is a schematic plan view illustrating an embodiment of the pixel of FIG. 1.

FIG. 9 is a schematic plan view illustrating an embodiment of the pixel of FIG. 1.

Referring to FIG. 9, the pixel PXL may include the display device layer (for example, the display device layer DPL of FIG. 2) and the pixel circuit layer (for example, the pixel circuit layer PCL of FIG. 2). The display element layer DPL may include the first pixel electrodes ELT1 and the light emitting layers EML of each of the first to third sub-pixels SPX1 to SPX3. The pixel circuit layer PCL may include the first and second power lines VSL and VDL, the sensing line SENL, the first to third data lines DL1 to DL3, a scan line SL, and a sensing control line SCL.

In an embodiment, the scan line SL may be disposed on the sensing control line SCL, the first and second power lines VSL and VDL, the sensing line SENL, and the first to third data lines DL1 to DL3. The scan line SL may extend in the first direction DR1. The scan line SL may extend between the storage capacitor Cst and the second data line DL2 of the first to third sub-pixels SPX1 to SPX3. The scan line SL may include a second gate electrode (for example, second gate electrodes GE2 of FIG. 12) of the second transistors T2 of the first to third sub-pixels SPX1 to SPX3.

In an embodiment, the sensing control line SCL may be disposed under the first and second power lines VSL and VDL, the sensing line SENL, and the first to third data lines DL1 to DL3. The sensing control line SCL may extend in the first direction DR1.

The sensing control line SCL may include at least two or more branch electrodes. The sensing control line SCL may include a first protrusion SCLa and a second protrusion SCLb. The first protrusion SCLa may include a branch electrode extending between the sensing line SENL and the second power line VDL. The first protrusion SCLa may be spaced apart from the second protrusion SCLb in the first direction DR1. The second protrusion SCLb may include a branch electrode extending between the second power line VDL and the storage capacitor Cst of the third sub-pixel SPX3. In an example, the first protrusion SCLa and the second protrusion SLCb may be separate branch electrodes extending to different areas.

The first protrusion SCLa may be an electrode extending from an area below the first power line VSL and the sensing line SENL to the first power line VSL and the sensing line SENL and extending between the sensing line SENL and the second power line VDL through the sensing line SENL. The second protrusion SCLb may be an electrode extending from a lower portion of the second power line VDL between the second power line VDL and the upper electrode UE of the third sub-pixel SPX3. A length of the second direction DR2 of the first protrusion SCLa may be longer than a length of the second direction DR2 of the second protrusion SCLb. In an example, the length of the second direction DR2 of the second protrusion SCLb may be substantially equal or similar to a length in which the first protrusion SCLa disposed between the first power line VSL and the sensing line SENL extends.

Referring to FIG. 9, each of the first to third sub-pixels SPX1 to SPX3 may include the first to third transistors T1 to T3. In an example, the third transistor T3 of the third sub-pixel SPX3 may include a third gate electrode GE3 and initialization semiconductor layers SE3, ACT3, and DE3. The initialization semiconductor layers SE3, ACT3, and DE3 of the third transistor T3 may include a third source electrode SE3, a third active pattern ACT3, and a third drain electrode DE3.

Figure 12:
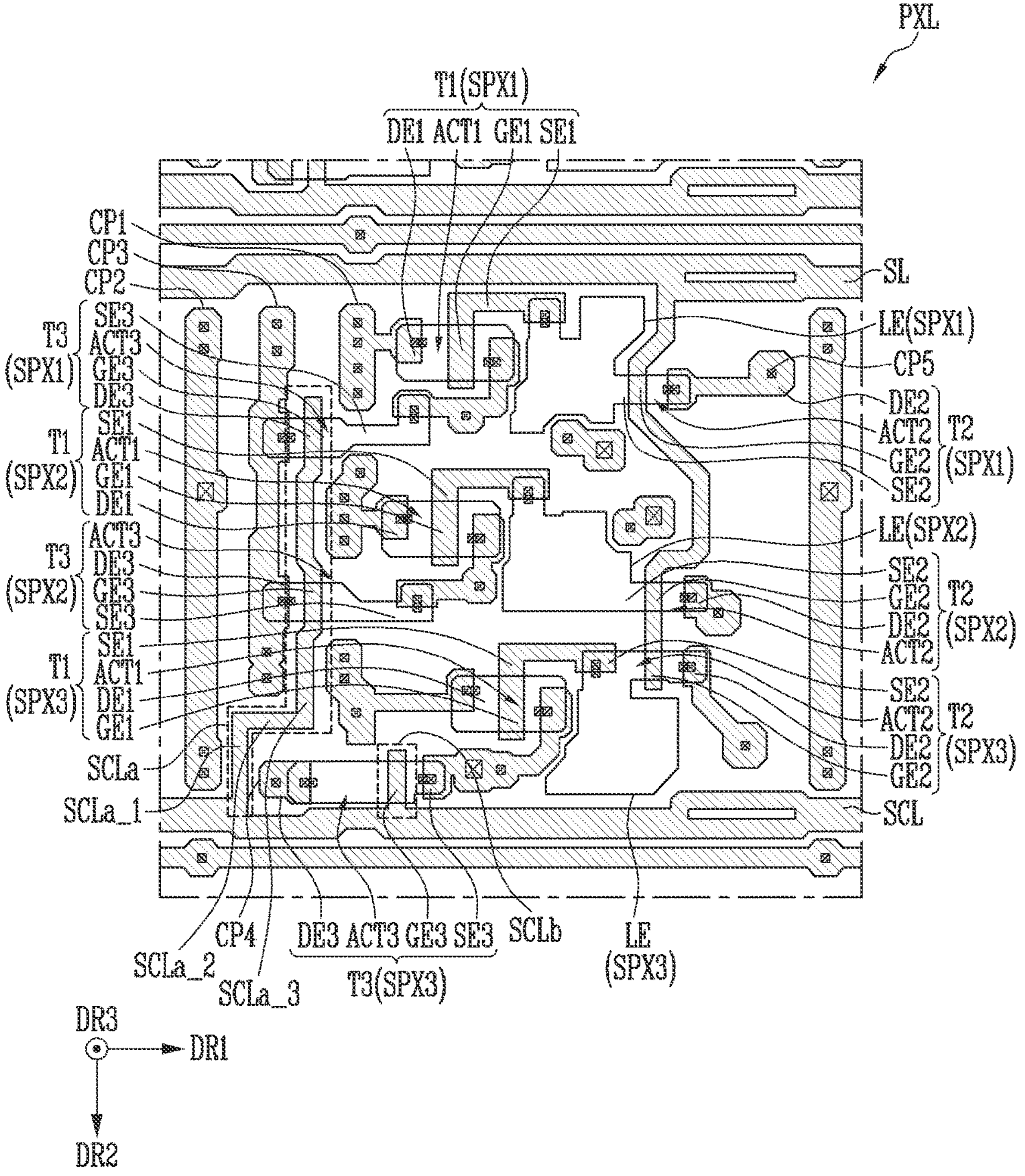
FIG. 12 is a schematic plan view illustrating only some configurations of the pixel of FIG. 9.

The first protrusion SCLa may include the third gate electrode of the third transistor T3 of the first and second sub-pixels SPX1 and SPX2 (for example, the third gate electrode GE3 of the first and second sub-pixels SPX1 and SPX2 of FIG. 12). The second protrusion SCLb may include the third gate electrode GE3 of the third transistor T3 of the third sub-pixel SPX3.

The first and second power lines VSL and VDL, the sensing line SENL, and the first to third data lines DL1 to DL3 may be disposed in a first conductive layer (for example, the fourth conductive layer C4 of FIG. 4). The scan line SL and the sensing control line SCL may be disposed in a second conductive layer (for example, the third conductive layer C3 of FIG. 4) distinct from the first conductive layer.

The first pixel electrode ELT1 of the second sub-pixel SPX2 may overlap the first protrusion SCLa and may not overlap the second protrusion SCLb in a plan view. Since the first pixel electrode ELT1 and the light emitting layer EML of the second sub-pixel SPX2 may overlap the sensing control line SCL excluding an area where the second protrusion SCLb is disposed, an area where the first pixel electrode ELT1 and the light emitting layer EML of the second sub-pixel SPX2 are disposed (for example, a light emitting area) may be secured.

The first pixel electrode ELT1 of the third sub-pixel SPX3 may not overlap the second protrusion SCLb in a plan view. The first pixel electrode ELT1 of the third sub-pixel SPX3 may overlap the storage capacitor Cst of the third sub-pixel SPX3 in a plan view.

Figure 10:
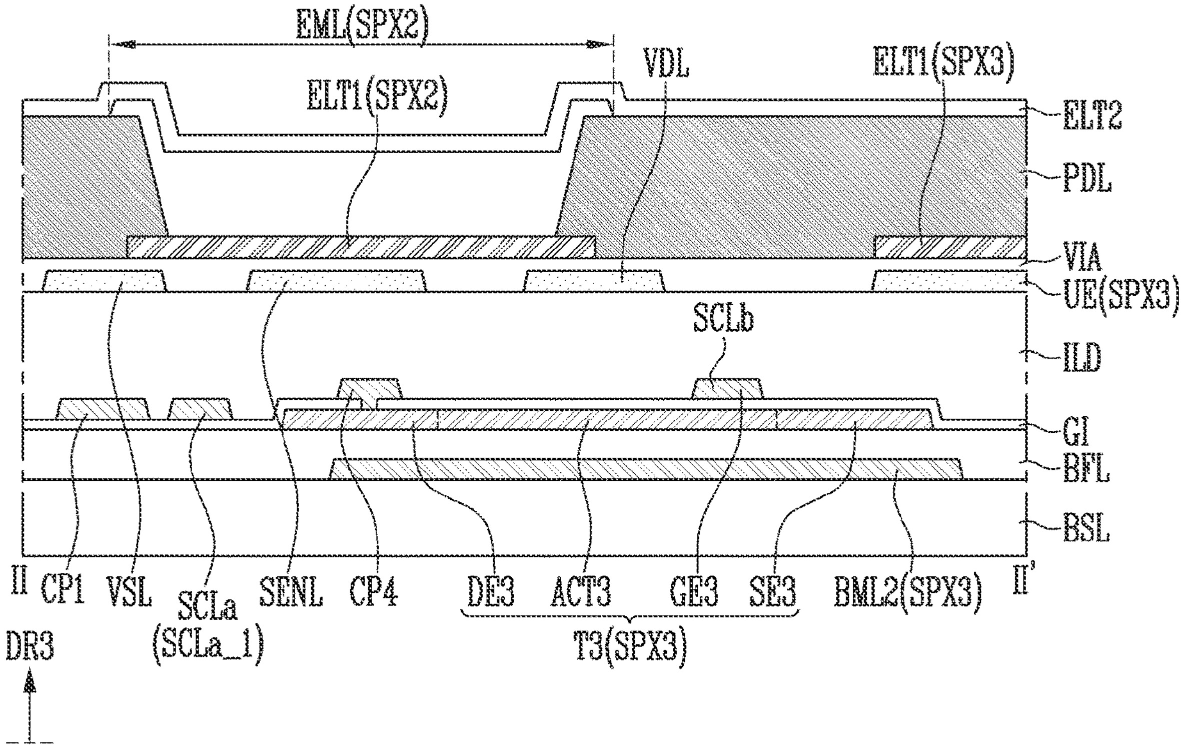
FIG. 10 is a schematic cross-sectional view taken along a line II-II' of FIG. 9.

FIG. 10 is a schematic cross-sectional view taken along a line II-II' of FIG. 9.

Referring to FIG. 10, the second lower auxiliary electrode BML2 of the third sub-pixel SPX3 may be disposed on the base layer BSL. The buffer layer BFL may be disposed to cover the second lower auxiliary electrode BML2. The initialization semiconductor layers SE3, ACT3, and DE3 of the third sub-pixel SPX3 may be disposed on the buffer layer BFL. The gate insulating layer GI may be disposed to cover the initialization semiconductor layers SE3, ACT3, and DE3 of the third sub-pixel SPX3. A first connection pattern CP1, the first protrusion SCLa, a fourth connection pattern CP4, and the second protrusion SCLb may be sequentially disposed in one direction on the gate insulating layer GI. The first connection pattern CP1 may be electrically connected to the first power line VSL through a contact hole (not shown). A partial area of the first protrusion SCLa (for example, a (1_1)-th protrusion SCLa_1 of FIG. 12) may be disposed on a right side of the first connection pattern CP1 and may be disposed between the first power line VSL and the sensing line SENL. The fourth connection pattern CP4 may overlap the initialization semiconductor layers SE3, ACT3, and DE3, and may be electrically connected to the third drain electrode DE3 through a contact hole (not shown). The second protrusion SCLb may be disposed on a right side of the fourth connection pattern CP4 and may be disposed between the second power line VDL and the upper electrode UE of the third sub-pixel SPX3.

In an embodiment, the second protrusion SCLb may be a sensing control line (for example, the sensing control line SCL of FIG. 9) extending between the second power line VDL and the upper electrode UE of the third sub-pixel SPX3. The second protrusion SCLb may be the third gate electrode GE3 of the third transistor T3 of the third sub-pixel SPX3.

In an embodiment, the interlayer insulating layer ILD may be disposed and/or formed to cover the first connection pattern CP1, the first protrusion SCLa, the fourth connection pattern CP4, and the second protrusion SCLb.

In an embodiment, the first power line VSL, the sensing line SNEL, the second power line VDL, and the upper electrode UE of the third sub-pixel SPX3 may be sequentially disposed spaced apart from each other in one direction (for example, the first direction DR1 of FIG. 9). In an example, the first power line VSL may not overlap the first protrusion SCLa. The sensing line SENL may not overlap one area of the first protrusion SLCa (for example, the (1_1)-th protrusion SCLa_1 of FIG. 12). The one area of the first protrusion SLCa may include an area where the first protrusion SCLa extends between the sensing line SENL and the second power line VDL. In an example, the second power line VDL and the upper electrode UE of the third sub-pixel SPX3 may not overlap the second protrusion SCLb. In an example, the via layer VIA entirely covering the first power line VSL, the sensing line SNEL, the second power line VDL, and the upper electrode UE of the third sub-pixel SPX3 may be disposed.

In an embodiment, the first pixel electrode ELT1 of the second sub-pixel SPX2 may be disposed on the via layer VIA. The pixel defining layer PDL may be disposed on the first pixel electrode ELT1. The pixel defining layer PDL may include an opening (not shown) exposing the first pixel electrodes ELT1. The light emitting layer EML may be disposed on the first pixel electrodes ELT1 exposed through the opening. The second pixel electrode ELT2 may be disposed on the light emitting layer EML and the pixel defining layer PDL. The second pixel electrode ELT2 may be provided in a plate shape over the entire area of the first to third sub-pixels (for example, the first to third sub-pixels SPX1 to SPX3 of FIG. 9).

In an embodiment, the second protrusion SCLb may not overlap the first pixel electrode ELT1 of the second sub-pixel SPX2. Therefore, in the manufacturing process of the display device, the repair process of the third transistor T3 of the third sub-pixel SPX3 may be performed without affecting the first pixel electrode ELT1 of the second sub-pixel SPX2.

Figure 11:
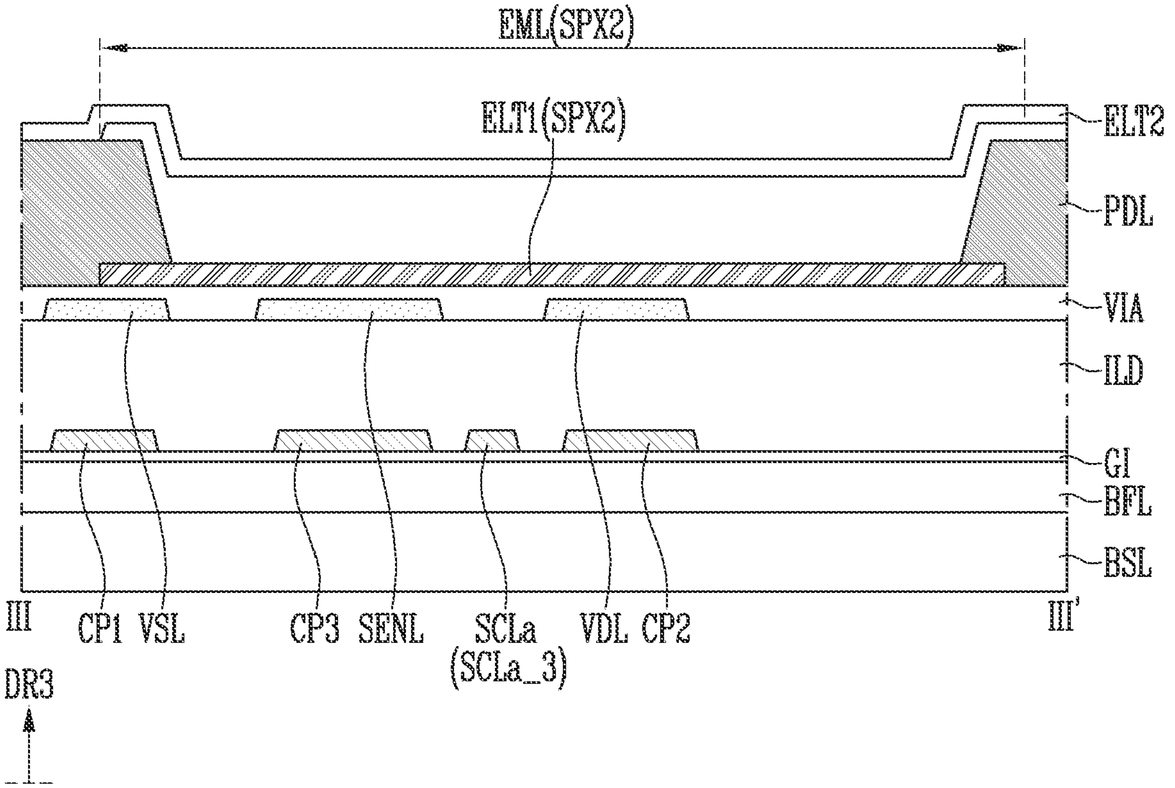
FIG. 11 is a schematic cross-sectional view taken along a line III-III' of FIG. 9.

FIG. 11 is a schematic cross-sectional view taken along a line III-III' of FIG. 9.

Referring to FIGS. 9 and 11, the first pixel electrode ELT1 of the second sub-pixel SPX2 may be disposed to overlap an area where the first protrusion SCLa is disposed. That is, the first pixel electrode ELT1 of the second sub-pixel SPX2 may overlap the sensing control line SCL excluding an area where the second protrusion SCLb is disposed. Accordingly, since the first pixel electrode ELT1 (and/or the light emitting layer EML) of the second sub-pixel SPX2 may be disposed from a lower end area of the first and second power lines VSL and VDL and the sensing line SENL, an aperture ratio for the second sub-pixel SPX2 may be secured.

Referring to FIG. 11, the first connection pattern CP1, a third connection pattern CP3, the first protrusion SCLa, and the second connection pattern CP2 may be sequentially disposed in one direction on the gate insulating layer GI. The first protrusion SCLa may be disposed between the second connection pattern CP2 and the third connection pattern CP3. In an example, the second connection pattern CP2 may be a conductive pattern electrically connected to the second power line VDL. The third connection pattern CP3 may be a conductive pattern electrically connected to the sensing line SENL.

Referring to FIG. 11, the first protrusion SCLa may be disposed between the sensing line SENL and the second power line VDL. The first protrusion SCLa shown in FIG. 11 (for example, a (1_3)-th protrusion SCLa_3 of FIG. 12) may be an area extending from an area (for example, the (1_1)-th protrusion SCLa_1 of FIG. 12) of the first protrusions SLCa disposed between the first power line VSL and the sensing line SENL.

FIG. 12 is a schematic plan view illustrating only some configurations of the pixel of FIG. 9.

FIG. 12 is a diagram illustrating a connection relationship between the sensing control line SCL and the first to third transistors T1 to T3 included in each of the first to third sub-pixels SPX1 to SPX3.

The sensing control line SCL may include the first protrusion SCLa and the second protrusion SCLb.

In an embodiment, the first protrusion SCLa may include the (1_1)-th protrusion SCLa_1, a (1_2)-th protrusion SCLa_2, and the (1_3)-th protrusion SCLa_3. The (1_1)-th protrusion SCLa_1 may include a portion extending between the first power line VSL and the sensing line SENL. The (1_2)-th protrusion SCLa_2 may extend from the (1_1)-th protrusion SCLa_1 and may include a portion of the first protrusion SCLa bent at least once. The (1_2)-th protrusion SCLa_2 may include a portion extending from the (1_1)-th protrusion SCLa_1 and overlapping the sensing line SENL. The (1_3)-th protrusion SCLa_3 may include a portion extending from the (1_2)-th protrusion SCLa_2 and extending between the sensing line SENL and the second power line VDL.

In an embodiment, a height of the second direction DR2 of the second protrusion SCLb is substantially equal or similar to a height of the second direction DR2 of the (1_1)-th protrusion SLCa_1 of the first protrusion SCLa. The second protrusion SCLb may be disposed below the (1_2)-th protrusion SLCa_2 of the first protrusion SCLa.

Each of the first to third sub-pixels SPX1 to SPX3 may include the first to third transistors T1 to T3.

The second connection pattern CP2 may overlap one area of the first power line VSL. The second pixel electrode (for example, the second pixel electrode ELT2 of FIG. 3) may be electrically connected to the first power line VSL through the second connection pattern CP2.

The first transistor T1 may include a first gate electrode GE1 and driving semiconductor layers SE1, ACT1, and DE1. The driving semiconductor layers SE1, ACT1, and DE1 may include a first source electrode SE1, a first active pattern ACT1, and a first drain electrode DE1. The first transistor T1 may receive a data voltage according to a switching operation of the second transistor T2, and transfer a driving current to the light emitting element (for example, the light emitting element LD of FIG. 3) according to the voltage stored in the storage capacitor Cst.

The first gate electrode GE1 may be electrically connected to a second source electrode SE2 of the second transistor T2 through a corresponding contact hole. The driving semiconductor layers SE1, ACT1, and DE1 may be positioned under the first gate electrode GE1 and may overlap the first gate electrode GE1. The first source electrode SE1 and the first drain electrode DE1 may be doped with an impurity, and thus the first source electrode SE1 and the first drain electrode DE1 may have conductivity. The first active pattern ACT1 may be formed of an intrinsic semiconductor layer that is not doped with an impurity. The first active pattern ACT1 may configure a channel area of the first transistor T1.

The first gate electrode GE1 may be electrically connected to the second source electrode SE2 of the second transistor T2. The first gate electrode GE1 may surround at least one area of the lower electrode LE. The first gate electrode GE1 may include a portion bent to surround at least a portion of the storage capacitor Cst.

The first connection pattern CP1 may overlap one area of the second power line VDL. One end of the first connection pattern CP1 may be electrically connected to the first drain electrode DE1. Another end of the first connection pattern CP1 may be electrically connected to the second power line VDL. The first drain electrode DE1 and the second power line VDL may be electrically connected through the first connection pattern CP1.

The second transistor T2 may include a second gate electrode GE2 and switching semiconductor layers SE2, ACT2, and DE2. The switching semiconductor layers SE2, ACT2, and DE2 may include the second source electrode SE2, a second active pattern ACT2, and a second drain electrode DE2. The second transistor T2 may be turned on according to a scan signal supplied through the scan line SL to transfer a reference voltage or data voltages provided from the first to third data lines DL1 to DL3 to the first gate electrode GE1 of the first transistor T1 and the lower electrode LE.

The second gate electrode GE2 may be integrally formed with the scan line SL. The second gate electrode GE2 may overlap the switching semiconductor layers SE2, ACT2, and DE2. The second source electrode SE2 and the second drain electrode DE2 may be doped with an impurity, and thus the second source electrode SE2 and the second drain electrode DE2 may have conductivity. The second active pattern ACT2 may be formed of an intrinsic semiconductor layer that is not doped with an impurity. The second active pattern ACT2 may configure a channel area of the second transistor T2.

A fifth connection pattern CP5 may overlap one area of each of the first to third data lines DL1 to DL3. One end of the fifth connection pattern CP5 may be electrically connected to the second drain electrode DE2. Another end of the fifth connection pattern CP5 may be electrically connected to the first to third data lines DL1 to DL3. The second drain electrode DE2 and the first to third data lines DL1 to DL3 may be electrically connected through the fifth connection pattern CP5. In an example, the second drain electrode DE2 of the first sub-pixel SPX1 and the first data line DL1 may be electrically connected through the fifth connection pattern CP5.

The third transistor T3 may include a third gate electrode GE3 and initialization semiconductor layers SE3, ACT3, and DE3. The initialization semiconductor layers SE3, ACT3, and DE3 may include a third source electrode SE3, a third active pattern ACT3, and a third drain electrode DE3. The third transistor T3 may be turned on according to the sensing control signal provided from the sensing control line SCL, transfer a sensing voltage (initialization voltage) to the first pixel electrode ELT1 or the upper electrode UE, and initialize a voltage of the first pixel electrode ELT1.

The third gate electrode GE3 of the first and second sub-pixels SPX1 and SPX2 may be integrally formed with the (1_3)-th protrusion SCLa_3 of the first protrusion SCLa.

The third gate electrode GE3 of the third sub-pixel SPX3 may be integrally formed with the second protrusion SCLb.

The third source electrode SE3 and the third drain electrode DE3 may be doped with an impurity, and thus the third source electrode SE3 and the third drain electrode DE3 may have conductivity. The third active pattern ACT3 may be formed of an intrinsic semiconductor layer that is not doped with an impurity. The third active pattern ACT3 may configure a channel area of the third transistor T3.

The third source electrode SE3 of each of the first to third sub-pixels SPX1 to SPX3 may be electrically connected to the first pixel electrode (for example, the first pixel electrodes ELT1 of FIG. 7) of each of the first to third sub-pixels SPX1 to SPX3 through a contact hole (not shown).

The third connection pattern CP3 and the fourth connection pattern CP4 may overlap one area of the sensing line SENL. The third connection pattern CP3 and the fourth connection pattern CP4 may be disposed spaced apart from each other in the second direction DR2. In an example, the (1_2)-th protrusion SCLa_2 of the first protrusion SCLa may be disposed between the third connection pattern CP3 and the fourth connection pattern CP4.

One end of the third connection pattern CP3 may be electrically connected to the third drain electrode DE3 of the first and second sub-pixels SPX1 and SPX2 through a corresponding contact hole. Another end of the third connection pattern CP3 may be electrically connected to the sensing line SENL through a corresponding contact hole. The third drain electrode DE3 and the sensing line SENL of the first and second sub-pixels SPX1 and SPX2 may be electrically connected to each other through the third connection pattern CP3.

One end of the fourth connection pattern CP4 may be electrically connected to the third drain electrode DE3 of the third sub-pixel SPX3 through a corresponding contact hole. Another end of the fourth connection pattern CP4 may be electrically connected to the sensing line SENL through a corresponding contact hole. The third drain electrode DE3 and the sensing line SENL of the third sub-pixel SPX3 may be electrically connected to each other through the fourth connection pattern CP4.

Figure 13:
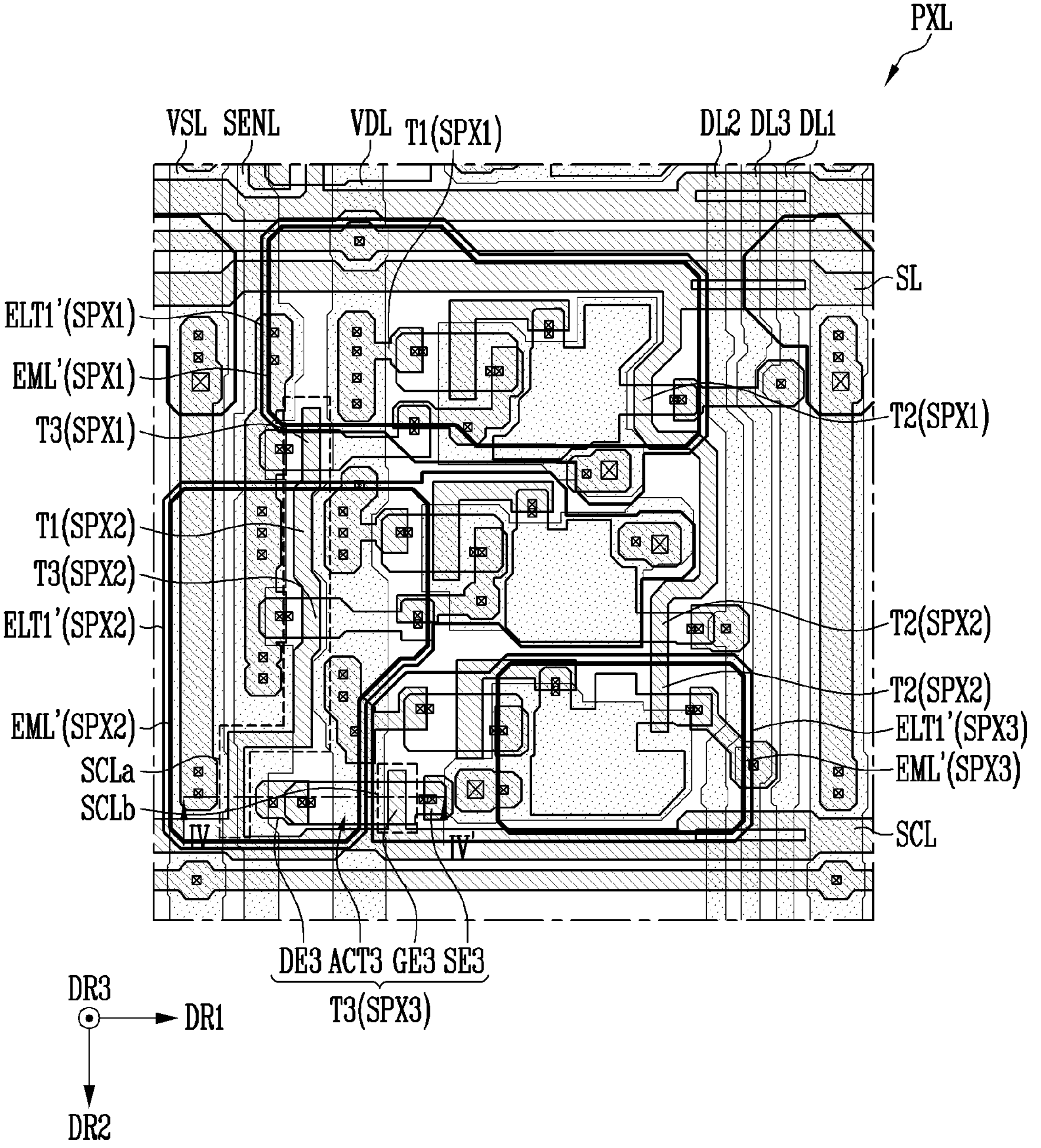
FIG. 13 is a schematic plan view illustrating another embodiment of the pixel of FIG. 1.

FIG. 13 is a schematic plan view illustrating another embodiment of the pixel of FIG. 1.

An overlapping description of configurations other than a first pixel electrode ELT1' and a light emitting layer EML', which are the same as or corresponding to the configurations shown in FIGS. 6 and 9 is omitted.

Referring to FIG. 13, the display device layer (for example, the display device layer DPL of FIG. 2) of the pixel PXL may include the first pixel electrode ELT1' and the light emitting layer EML'.

The first pixel electrode ELT1' of the first sub-pixel SPX1, the first pixel electrode ELT1' of the second sub-pixel SPX2, and the first pixel electrode ELT1' of the third sub-pixel SPX3 may be sequentially disposed spaced apart from each other in the second direction DR2.

The first pixel electrode ELT1' of the first sub-pixel SPX1 may be disposed on the first pixel electrode ELT1' of the second and third sub-pixels SPX2 and SPX3.

The first pixel electrode ELT1' of the second sub-pixel SPX2 may be disposed in the second direction DR2 (or below) of the first pixel electrode ELT1' of the first sub-pixel SPX1, and thus may surround at least one area of the first pixel electrode ELT1' of the third sub-pixel SPX3. The first pixel electrode ELT1' of the second sub-pixel SPX2 may include a bent portion to surround at least a portion of the first pixel electrode ELT1' of the third sub-pixel SPX3.

The first pixel electrode ELT1' of the third sub-pixel SPX3 may be disposed in the second direction DR2 (or below) of the first pixel electrode ELT1' of the second sub-pixel SPX2.

The light emitting layer EML' of the first sub-pixel SPX1 may be disposed on the first pixel electrode ELT1' of the first sub-pixel SPX1. The light emitting layer EML' of the first sub-pixel SPX1 may cover most area of the first pixel electrode ELT1' of the first sub-pixel SPX1 in a plan view.

The light emitting layer EML' of the second sub-pixel SPX2 may be disposed on the first pixel electrode ELT1' of the second sub-pixel SPX2. The light emitting layer EML' of the second sub-pixel SPX2 may be disposed on a lower left side of the light emitting layer EML' of the first sub-pixel SPX1.

The light emitting layer EML' of the third sub-pixel SPX3 may be disposed on the first pixel electrode ELT1' of the third sub-pixel SPX3. The light emitting layer EML' of the third sub-pixel SPX3 may be disposed on a lower right side of the light emitting layer EML' of the first sub-pixel SPX1.

The light emitting layer EML' of the second and third sub-pixels SPX2 and SPX3 may be disposed in a lower area of the light emitting layer EML' of the first sub-pixel SPX1. One area of the light emitting layer EML' of the second sub-pixel SPX2 may face the light emitting layer EML' of the third sub-pixel SPX3 in the first direction DR1.

The first pixel electrode ELT1' of the second sub-pixel SPX2 may overlap the first protrusion SCLa and may not overlap the second protrusion SCLb in a plan view. The first pixel electrode ELT1' of the third sub-pixel SPX3 may overlap the second protrusion SCLb in a plan view. The light emitting layer EML' of the third sub-pixel SPX3 may be disposed spaced apart from the second protrusion SCLb in the first direction DR1, and may overlap the storage capacitor (for example, the storage capacitor Cst of the third sub-pixel SPX3 of FIG. 6) in a plan view.

Since the first pixel electrode ELT1' and the light emitting layer EML' of the second sub-pixel SPX2 may overlap the sensing control line SCL excluding an area where the second protrusion SCLb is disposed, an area where the first sub-pixel ELT1' and the light emitting layer EML' of the second sub-pixel SPX2 are disposed (for example, a light emitting area) may be secured.

Figure 14:
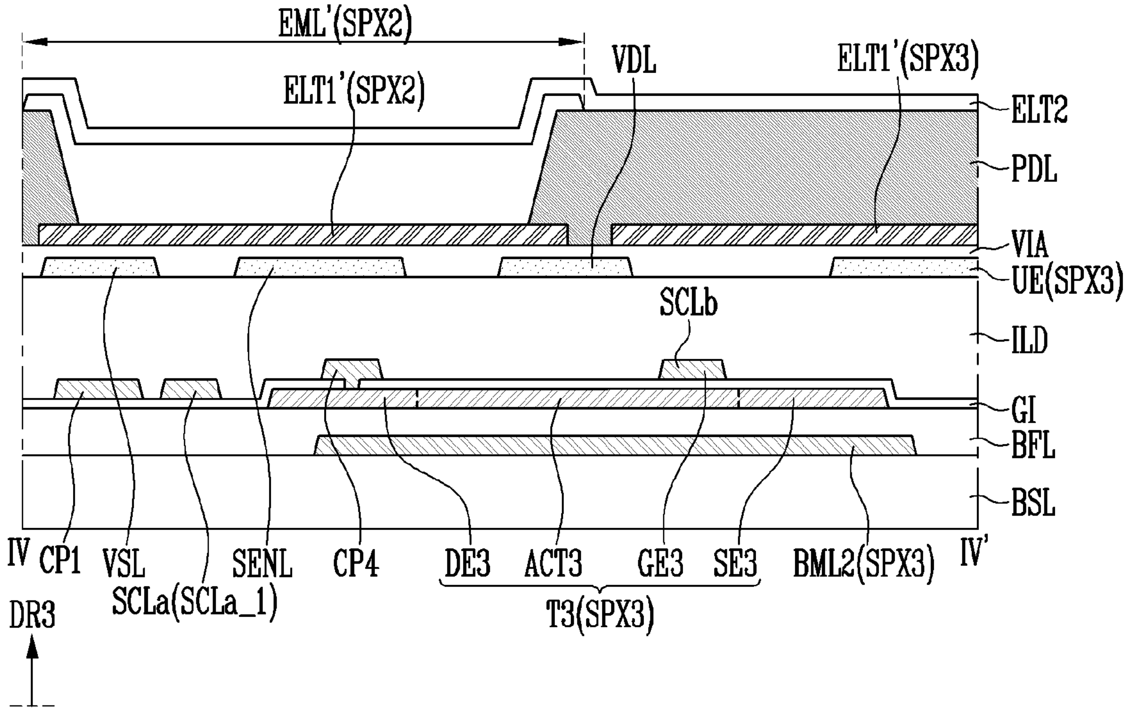
FIG. 14 is a schematic cross-sectional view taken along a line IV-IV' of FIG. 13.

FIG. 14 is a schematic cross-sectional view taken along a line IV-IV' of FIG. 13.

Referring to 14, the first pixel electrode ELT1' of the second sub-pixel SPX2 and the first pixel electrode ELT1' of the third sub-pixel SPX3 may be disposed on the via layer VIA.

The first pixel electrode ELT1' of the second sub-pixel SPX2 may overlap the first power line VSL and the sensing line SENL. The first pixel electrode ELT1' of the third sub-pixel SPX3 may overlap the upper electrode UE of the third sub-pixel SPX3.

The pixel defining layer PDL may be disposed on the first pixel electrode ELT1' of the second sub-pixel SPX2 and the first pixel electrode ELT1' of the third sub-pixel SPX3. The pixel defining layer PDL may include an opening (not shown) exposing the first pixel electrode ELT1' of the second sub-pixel SPX2. The light emitting layer EML' of the second sub-pixel SPX2 may be disposed on the first pixel electrode ELT1' exposed through the opening of the pixel defining layer PDL.

The pixel defining layer PDL may cover the first pixel electrode ELT1' of the third sub-pixel SPX3 adjacent to the first pixel electrode ELT1' of the second sub-pixel SPX2.

In an embodiment, the second protrusion SCLb may not overlap the first pixel electrode ELT1' of the second sub-pixel SPX2. Therefore, in the manufacturing process of the display device, the repair process of the third transistor T3 of the third sub-pixel SPX3 may be performed without affecting the first pixel electrode ELT1' of the second sub-pixel SPX2.

Figure 15:
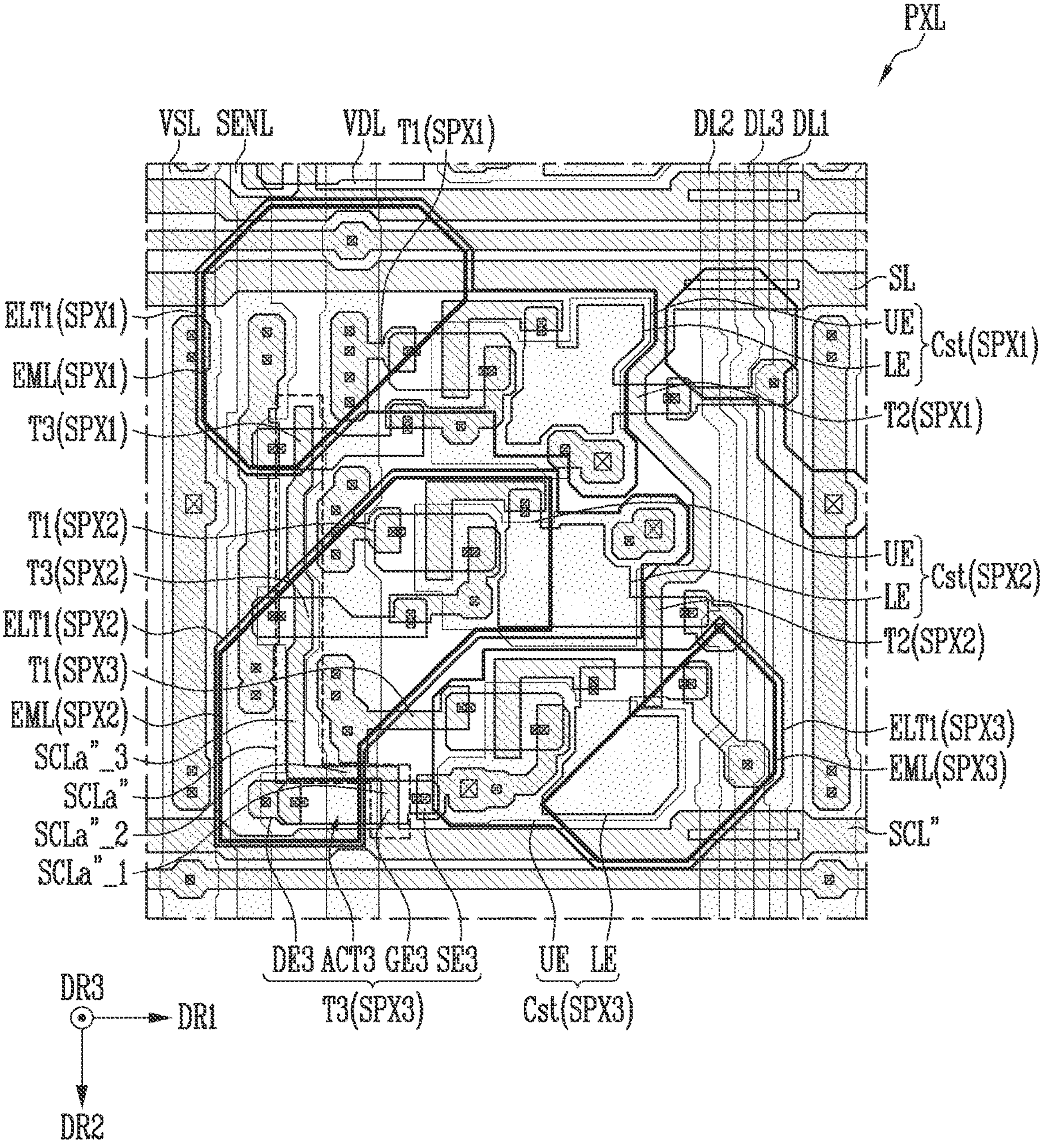
FIG. 15 is a schematic plan view illustrating another embodiment of the pixel of FIG. 1.

FIG. 15 is a schematic plan view illustrating another embodiment of the pixel of FIG. 1.

Referring to FIG. 15, an overlapping description of configurations other than a sensing control line SCL", which are the same as or corresponding to the configurations shown in FIGS. 6 and 9 is omitted.

In an embodiment, the sensing control line SCL" may be disposed under the first and second power lines VSL and VDL, the sensing line SENL, and the first to third data lines DL1 to DL3. The sensing control line SCL" may extend in the first direction DR1.

The sensing control line SCL" may include only one branch electrode. The sensing control line SCL" may include a first protrusion SCL". The first protrusion SCL" may include a branch electrode extending between the second power line VDL and the storage capacitor Cst.

The first protrusion SCLa" may include a (1_1)-th protrusion SCLa"_1, a (1_2)-th protrusion SCLa"_2, and a (1_3)-th protrusion SCLa"_3. In an example, the (1_1)-th protrusion SCLa"_1, the (1_2)-th protrusion SCLa"_2, and the (1_3)-th protrusion SCLa"_3 may be integrally formed.

The (1_1)-th protrusion SCLa"_1 may include a partial electrode extending between the second power line VDL and the storage capacitor Cst. The (1_2)-th protrusion SCLa"_2 may include a partial electrode extending from the (1_1)-th protrusion SCLa"_1 and crossing the second power line VDL. The (1_2)-th protrusion SCLa"_2 may overlap the second power line VDL in a plan view. The (1_3)-th protrusion SCLa"_3 may include a partial electrode extending from the (1_2)-th protrusion SCLa"_2 and extending between the sensing line SENL and the second power line VDL.

The (1_1)-th protrusion SCLa"_1 may include the third gate electrode of the third transistor T3 of the third sub-pixel SPX3 (for example, the third gate electrode GE3 of the first and second sub-pixels SPX1 and SPX2 of FIG. 12). The (1_3)-th protrusion SCLa"_3 may include the third gate electrodes GE3 of the third transistor T3 of the first and second sub-pixels SPX1 and SPX2.

The first pixel electrode ELT1 of the third sub-pixel SPX3 may not overlap the (1_1)-th protrusion SCLa"_1 in a plan view. The first pixel electrode ELT1 of the third sub-pixel SPX3 may overlap the storage capacitor Cst of the third sub-pixel SPX3 in a plan view.

The first pixel electrode ELT1 of the second sub-pixel SPX2 may overlap the (1_3)-th protrusion SCLa"_3 and may not overlap the (1_1)-th protrusion SCLa"_1 in a plan view. Since the first pixel electrode ELT1 and the light emitting layer EML of the second sub-pixel SPX2 may overlap the sensing control line SCL excluding an area where the (1_1)-th protrusion SCLa"_1 is disposed, an area where the first pixel electrode ELT1 and the light emitting layer EML of the second sub-pixel SPX2 (for example, a light emitting area) may be secured.

The display device according to embodiments of the disclosure may perform a repair process for a pixel circuit of an adjacent sub-pixel SPX3 without removing a pixel electrode ELT1 or ELT1' of a corresponding sub-pixel SPX2 as a pixel electrode (for example, the pixel electrode of the second sub-pixel SPX2 of FIG. 9 (for example, the first pixel electrode ELT1 of the second sub-pixel SPX2 of FIG. 9 or the first pixel electrode ELT1' of the second sub-pixel SPX2 of FIG. 13) of the corresponding sub-pixel (for example, the second sub-pixel SPX2 of FIG. 6) is disposed so as not to overlap an initialization transistor (for example, the third transistor T3 of the third sub-pixel SPX3 of FIG. 9).

In addition, an area (or an aperture ratio) where the pixel electrode ELT1 of a corresponding sub-pixel SPX3 is disposed may be secured by disposing a gate electrode of an initialization transistor T3 of the corresponding sub-pixel SPX3 and a gate electrode of an initialization transistor of an adjacent sub-pixel SPX2 (for example, the third transistor T3 of the second sub-pixel SPX2 of FIG. 9) at different lines.

Although the above has been described with reference to the embodiments of the disclosure, those skilled in the art will understand that the disclosure may be variously modified and changed without departing from the spirit and scope of the disclosure described in the claims.

What is claimed is:

1. A display device comprising:
a substrate including a first sub-pixel, a second sub-pixel, and a third sub-pixel;
a pixel circuit layer disposed on the substrate and including a plurality of transistors; and
a display element layer disposed on the pixel circuit layer and including first pixel electrodes of each of the first to third sub-pixels,
wherein the pixel circuit layer comprises:
a first power line, a sensing line, a second power line, and a data line sequentially disposed spaced apart from each other in a first direction and extending in a second direction crossing the first direction; and
a sensing control line disposed on one side of the first power line, the sensing line, the second power line, and the data line and extending in the first direction in a plan view,
the sensing control line includes a first protrusion extending between the sensing line and the second power line and a second protrusion spaced apart from the first protrusion and extending between the second power line and the data line,
the first protrusion includes gate electrodes of a third transistor of the first and second sub-pixels, and
the second protrusion includes a gate electrode of a third transistor of the third sub-pixel.

2. The display device according to claim 1, wherein the first pixel electrode of the second sub-pixel overlaps a portion of the first protrusion and does not overlap the second protrusion in a plan view.

3. The display device according to claim 1, wherein the first power line, the sensing line, the second power line, and the data line are disposed in a first conductive layer, and
the sensing control line is disposed in a second conductive layer different from the first conductive layer.

4. The display device according to claim 3, wherein the first protrusion extends between the first power line and the sensing line and extends between the sensing line and the second power line through at least one bent portion.

5. The display device according to claim 4, wherein the at least one bent portion of the first protrusion overlaps the sensing line in a plan view, and
the at least one bent portion of the first protrusion is disposed above the second protrusion.

6. The display device according to claim 1, wherein the first pixel electrode of the third sub-pixel does not overlap the first protrusion and the second protrusion in a plan view.

7. The display device according to claim 6, wherein the display element layer further includes light emitting layers disposed on the first pixel electrodes of each of the first to third sub-pixels, and
the light emitting layer of the first sub-pixel, the light emitting layer of the second sub-pixel, and the light emitting layer of the third sub-pixel are disposed spaced apart from each other in a diagonal direction between the first direction and the second direction.

8. The display device according to claim 1, wherein the first pixel electrode of the third sub-pixel does not overlap the first protrusion and overlaps the second protrusion in a plan view.

9. The display device according to claim 8, wherein the first pixel electrode of the second sub-pixel surrounds one area of the first pixel electrode of the third sub-pixel, a light emitting layer of the second sub-pixel is disposed in a left area below a light emitting area of the first sub-pixel, and a light emitting layer of the third sub-pixel is disposed in a right area below the light emitting area of the first sub-pixel.

10. The display device according to claim 1, wherein the data line includes a first data line, a second data line, and a third data line, the second data line, the third data line, and the first data line are sequentially disposed spaced apart from each other in the first direction and extend in the second direction, and the second protrusion of the sensing control line extends between the second power line and the second data line.

11. The display device according to claim 10, further comprising:

a plurality of storage capacitors arranged adjacent to each other along the second direction between the second power line and the second data line, wherein the second protrusion is disposed between the second power line and the plurality of storage capacitors.

12. The display device according to claim 11, wherein each of the plurality of storage capacitors includes an upper electrode and a lower electrode, and the upper electrode is disposed in the same layer as the first power line, the sensing line, the second power line, and the data line.

13. The display device according to claim 1, wherein the display element layer further includes a pixel defining layer including openings exposing the first pixel electrode of the first sub-pixel, the first pixel electrode of the second sub-pixel, and the first pixel electrode of the third sub-pixel, and the second protrusion of the sensing control line overlaps the pixel defining layer in a plan view.

14. The display device according to claim 13, wherein one area of the first protrusion of the sensing control line overlaps the opening exposing the first pixel electrode of the second sub-pixel in a plan view.

15. A display device comprising:

a substrate including a first sub-pixel, a second sub-pixel, and a third sub-pixel;

a pixel circuit layer disposed on the substrate and including a plurality of transistors; and a display element layer disposed on the pixel circuit layer and including first pixel electrodes of each of the first to third sub-pixels, the pixel circuit layer comprises:

a first power line, a sensing line, a second power line, and a data line sequentially disposed spaced apart from each other in a first direction and extending in a second direction crossing the first direction; and a sensing control line disposed on one side of the first power line, the sensing line, the second power line, and the data line and extending in the first direction in a plan view, the sensing control line includes a first protrusion extending between the second power line and the data line and a second protrusion extending from the first protrusion and extending between the sensing line and the second power line, the first protrusion includes a gate electrode of a third transistor of the third sub-pixel, and the second protrusion includes a gate electrode of a third transistor of the first sub-pixel and a gate electrode of a third transistor of the second sub-pixel.

16. The display device according to claim 15, wherein the first pixel electrode of the second sub-pixel overlaps a portion of the second protrusion and does not overlap the first protrusion in a plan view.

17. The display device according to claim 15, wherein the first power line, the sensing line, the second power line, and the data line are disposed in a first conductive layer, and the sensing control line is disposed in a second conductive layer different from the first conductive layer.

18. The display device according to claim 17, wherein the second protrusion extends from the first protrusion and extends between the sensing line and the second power line through at least one bent portion, and the at least one bent portion of the second protrusion overlaps the second power line in a plan view.

19. The display device according to claim 15, wherein the first pixel electrode of the third sub-pixel does not overlap the first protrusion and the second protrusion in a plan view.

20. The display device according to claim 19, wherein the display element layer further includes light emitting layers disposed on the first pixel electrodes of each of the first to third sub-pixels, and the light emitting layer of the first sub-pixel, the light emitting layer of the second sub-pixel, and the light emitting layer of the third sub-pixel are disposed spaced apart from each other in a diagonal direction between the first direction and the second direction.

* * * * *